US006442739B1

(12) United States Patent
Palermo et al.

(10) Patent No.: US 6,442,739 B1
(45) Date of Patent: Aug. 27, 2002

(54) SYSTEM AND METHOD FOR TIMING ABSTRACTION OF DIGITAL LOGIC CIRCUITS

(75) Inventors: Robert J. Palermo, Shoreview, MN (US); Karem A. Sakallah, Ann Arbor, MI (US); Shekaripuram V. Venkatesh, San Jose; Mohammad Mortazavi, Fremont, both of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/215,633

(22) Filed: Dec. 17, 1998

Related U.S. Application Data

(60) Provisional application No. 60/083,890, filed on May 1, 1998.

(51) Int. Cl.[7] .............................................. G06F 17/50
(52) U.S. Cl. ......................................................... 716/6
(58) Field of Search ................................ 716/1, 2, 4, 5, 716/6, 8, 10, 12, 13, 18

(56) References Cited

U.S. PATENT DOCUMENTS

| | | | | |
|---|---|---|---|---|
| 5,740,347 A | * | 4/1998 | Avidan .................. | 395/183.09 |
| 5,864,487 A | * | 1/1999 | Merryman et al. ......... | 364/491 |
| 6,023,568 A | * | 2/2000 | Segal ............................ | 716/6 |
| 6,080,206 A | * | 7/2000 | Tadokoro et al. ............. | 716/10 |

OTHER PUBLICATIONS

Chen et al., High–Level Scheduling Model and Control Synthesis for a Broad Range of Design Applications, IEEE, pp. 236–243, 1997.*
Dagenais et al., "on the Calculation of Optimal Clocking Parameters in Synchronous Circuits w/ Level–Sensitive Latches," IEEE, pp. 268–278, 1989.*

Park et al., "Theory of Clocking for Maximum Execution Overlap of High–Speed Digital Systems," IEEE, pp. 678–690, 1988.*
Park et al., "Schwa: A Software Package for Synthesis of Pipelines from Behavioral Specifications," IEEE, pp. 356–370, 1988.*
Sakallah et al., "Analysis and Design of Latch–Controlled Synchronous Digital Circuits", IEEE, pp. 322–333, 1992.*
Burks, Timothy M., et al., "Critical Paths in Circuits with Level–Sensitive Latches," IEEE Transactions on Very Large Scale Integration (VLSI) Systems, vol. 3, No. 2, Jun. 1995, pp. 273–391.
Cherry, James J., "Pearl: A CMOS Timing Analyzer," 25th ACM/IEEE Design Automation Conference Proceedings 1988, pp. 148–153.
Sakallah, Karem A., et al., "Analysis and Design of Latch–Controlled Synchronous Digital Circuits," 27th ACM/IEEE Design Automation Conference Proceedings 1990, pp. 111–117.

* cited by examiner

*Primary Examiner*—Matthew Smith
*Assistant Examiner*—Leigh Marie Garbowski
(74) *Attorney, Agent, or Firm*—Lyon & Lyon LLP

(57) ABSTRACT

A computer-implemented method abstracts the timing constraints for latches internal to a digital logic circuit, resulting in a clock characterization model. Timing information (such as propagation delays, set-up and hold requirements) for latches and combinational logic circuits contained in a digital logic circuit are received, as is a description of a class of clock scheme for clocking the circuit. Clock parameters are selected for the clock scheme class. The internal timing constraints for the digital logic circuit are expressed as timing constraint expressions which are a function of the clock parameters. The expressions are combined to define a region of feasible clock operation expressed in terms of the clock parameters.

33 Claims, 9 Drawing Sheets

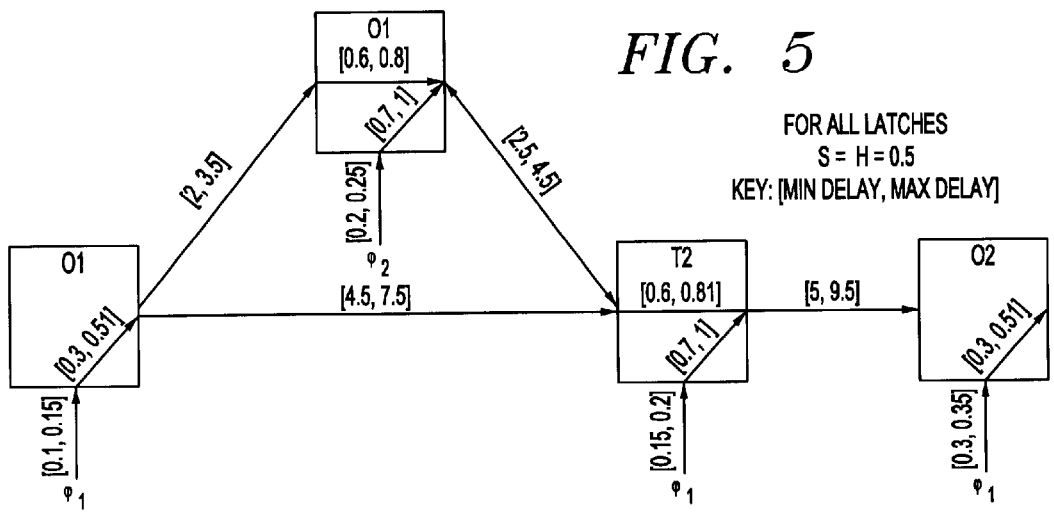

FIG. 5

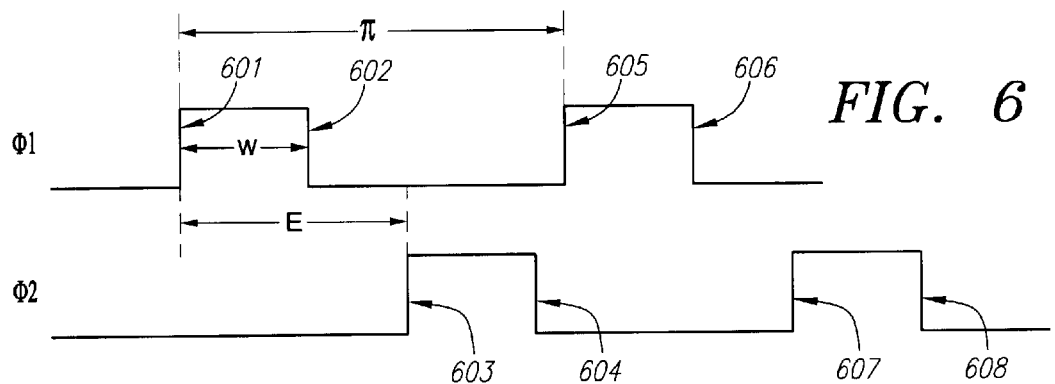

FIG. 6

| SIGNAL PATH | CONSTRAINT | TIMING CONSTRAINT EXPRESSION | EXPRESSION ID | DISPOSITION |
|---|---|---|---|---|
| O1-T1 | SET-UP<br>HOLD | $E + w \geq 4.45$<br>$E - w \geq -1.65$ | E1<br>E2 | CONSOLIDATED INTO E8<br>CONSOLIDATED INTO E14 |
| O1-T1-T2 | SET-UP<br>MAX TRANS. | $2E + w \geq 9.8$<br>$E \geq 4.525$ | E3<br>E4 | REDUNDANT<br>CONSOLIDATED INTO E7 |
| O1-T2 | SET-UP<br>HOLD | $w \geq 8.5$<br>$2E - w \geq 4.2$ | E5<br>E6 | REDUNDANT |
| O1-T2-O2 | SET-UP | $E \geq 9.325$ | E7 | |
| T1-T2 | SET-UP<br>HOLD | $E + w \geq 6.1$<br>$E - w \geq -2.7$ | E8<br>E9 | REDUNDANT<br>CONSOLIDATED INTO E2 |
| T1-T2-O2 | SET-UP | $E \geq 5.417$ | E10 | CONSOLIDATED INTO E7 |
| T2-O2 | SET-UP<br>HOLD | $E \geq 5.45$<br>$0 \geq -5$ | E11<br>E12 | CONSOLIDATED INTO E7<br>TRUE |
| --<br>-- | OTHER<br>OTHER | $w \geq 0.1$<br>$E - w \geq -0.1$ | E13<br>E14 | CONSOLIDATED INTO E5 |

FIG. 7

| SIGNAL PATH | TIMING REQUIREMENTS WITHOUT LOOP REQUIREMENT | | | TIMING REQUIREMENTS WITH LOOP REQUIREMENT | | | |
|---|---|---|---|---|---|---|---|
| | HOLD | SET-UP | MAX TRANS. | HOLD | SET-UP | MAX TRANS. | LOOP |
| O1-T1 | X | X | | X | X | | |
| O1-T1-T2 | | X | | | X | | |
| O1-T1-T2-T1 | | X | X | | X | | X |
| O1-T1-O2 | | X | | | X | | |
| T1-T2 | X | X | | X | X | | |
| T1-T2-T1 | | X | | | X | | X |
| T1-T2-T1-T2 | | X | X | | | | |
| T1-T2-T1-O2 | | X | | | | | |
| T1-O2 | X | X | | X | X | | |
| T2-T1 | X | X | | X | X | | |
| T2-T1-T2 | | X | | | X | | X |
| T2-T1-T2-T1 | | X | X | | | | |
| T2-T1-O2 | | X | | | X | | |

| PATH ID | SIGNAL PATH | MINIMUM DELAY | MAXIMUM DELAY |
|---|---|---|---|
| P1 | O1-T1 | 0.3 + 2 = 2.3 | 0.5 + 3.5 = 4.0 |
| P2 | O1-T1-T2 | | 0.5 + 3.5 + 0.8 + 4.5 = 9.3 |
| P3 | O1-T2 | 0.3 + 4.5 = 4.8 | 0.5 + 7.5 = 8.0 |
| P4 | O1-T2-O2 | | 0.5 + 7.5 + 0.8 + 9.5 = 18.3 |
| P5 | T1-T2 | 0.7 + 2.5 = 3.2 | 1 + 4.5 + = 5.5 |
| P6 | T1-T2-O2 | | 1 + 4.5 + 0.8 + 9.5 = 15.8 |
| P7 | T2-O2 | 0.7 + 5 = 5.7 | 1 + 9.5 = 10.5 |
*FIG. 10*
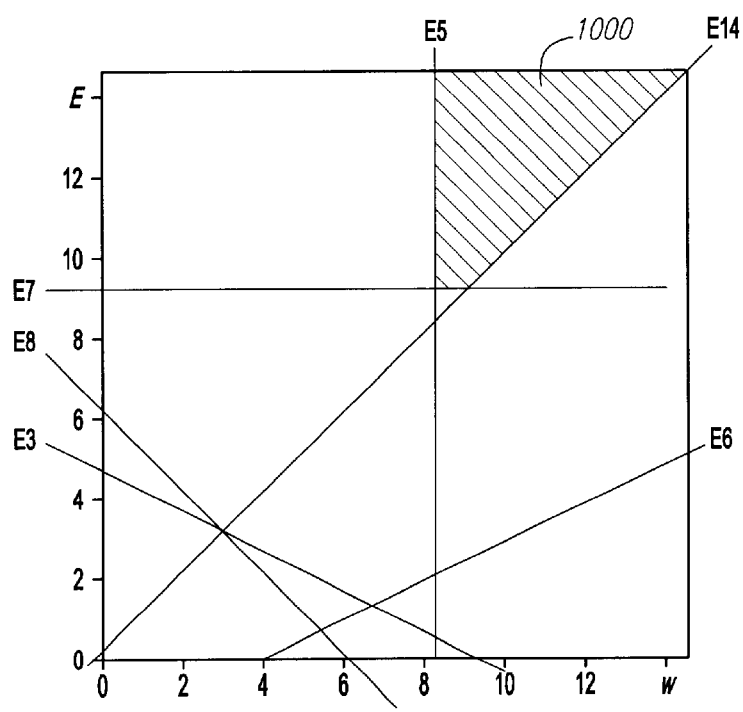
*FIG. 11*
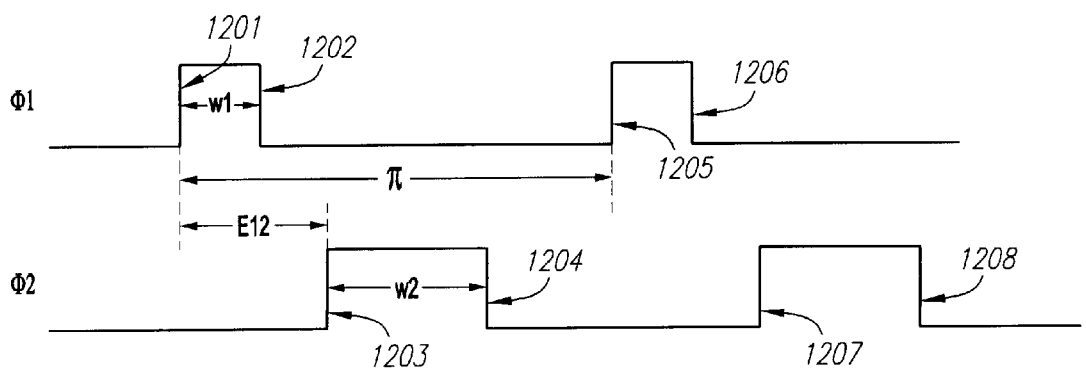
*FIG. 12*

| SYMBOL | DESCRIPTION |
|---|---|
| $\pi$ | CLOCK PERIOD |
| $o(i), c(i)$ | OPENING, CLOSING EVENT FOR LATCH i |
| $E[x,y]$ | TIME INTERVAL FROM EVENT x TO EVENT y |
| $qo(i), qc(i)$ | THE MINIMUM DELAY FROM THE CLOCK SOURCE TO THE C INPUT OF OF LATCH i FOR THE OPENING, CLOSING EVENT FOR LATCH i |
| $Qo(i), Qc(i)$ | THE MAXIMUM DELAY FROM THE CLOCK SOURCE TO THE C INPUT OF OF LATCH i FOR THE OPENING, CLOSING EVENT FOR LATCH i |
| $SR(i), SF(i)$ | SET-UP TIME FOR LATCH i FOR RISING, FALLING INPUT D |
| $HR(i), HF(i)$ | HOLD TIME FOR LATCH i FOR RISING, FALLING INPUT D |
| $\delta RR(i,D), \delta FR(i,D), \delta FF(i,D), \delta RF(i,D),$ | MINIMUM D-TO-Q DELAY FOR LATCH i FOR RISING, FALLING INPUT D AND RISING, FALLING OUTPUT Q |
| $\Delta RR(i,D), \Delta FR(i,D), \Delta FF(i,D), \Delta RF(i,D)$ | MAXIMUM D-TO-Q DELAY FOR LATCH i FOR RISING, FALLING INPUT D AND RISING, FALLING OUTPUT Q |
| $\delta R(i,C), \delta F(i,C),$ | MINIMUM C-TI-Q DELAY FOR LATCH i FOR RISING, FALLING OUTPUT Q |
| $\Delta R(i,C), \Delta F(i,C),$ | MAXIMUM C-TI-Q DELAY FOR LATCH i FOR RISING, FALLING OUTPUT Q |
| $\delta RR(i,j), \delta FR(i,j), \delta FF(i,j), \delta RF(i,j),$ | MAXIMUM DELAY FROM OUTPUT Q OF LATCH i TO INPUT D OF LATCH j FOR RISING, FALLING OUTPUT Q AND RISING, FALLING INPUT D |
| $\Delta RR(i,j), \Delta FR(i,j), \Delta FF(i,j), \Delta RF(i,j)$ | MAXIMUM DELAY FROM OUTPUT Q OF LATCH i TO INPUT D OF LATCH j FOR RISING, FALLING OUTPUT Q AND RISING, FALLING INPUT D |

FIG. 13

| SIGNAL PATH | CONSTRAINT | TIMING CONSTRAINT EXPRESSION |
|---|---|---|
| O1-T1 | SET-UP HOLD | $E12 + w2 \geq 4.45$ $\pi - E12 - w2 \geq -1.65$ |
| O1-T1-T2 | SET-UP MAX TRANS. | $\pi + w1 \geq 9.9$ $\pi \geq 9.05$ |
| O1-T2 | SET-UP HOLD | $w1 \geq 8.5$ $\pi - w1 \geq -4.2$ |
| O1-T2-O2 | SET-UP | $\pi \geq 18.65$ |
| T1-T2 | SET-UP HOLD | $\pi - E12 + w1 \geq -6.1$ $E12 - w1 \geq -2.7$ |
| T1-T2-O2 | SET-UP | $2\pi - E12 \geq 16.25$ |
| T2-O2 | SET-UP HOLD | $\pi \geq 10.9$ $0 \geq -5$ |
| -- | OTHER | $w1 \geq 0.1$ |
| -- | OTHER | $\pi - w1 \geq 0.1$ |
| -- | OTHER | $w2 \geq 0.1$ |
| -- | OTHER | $\pi - w2 \geq 0.1$ |

FIG. 14

SYSTEM AND METHOD FOR TIMING ABSTRACTION OF DIGITAL LOGIC CIRCUITS

CROSS-REFERENCE TO RELATED APPLICATION

This application claims the benefit of U.S. Provisional Patent Application Serial No. 60/083,890, "Timing Abstraction of Intellectual Property Blocks", by Robert J. Palermo, Shekaripuram V. Venkatesh, Mohammad Mortazavi, and Karem A. Sakallah, filed May 1, 1998, which subject matter is incorporated herein by reference.

BACKGROUND OF THE INVENTION

1. Field of the Invention

This invention relates generally to the generation of a timing model for a digital logic circuit, and more particularly, to the generation of a timing model which abstracts the timing constraints for latches internal to the digital logic circuit.

2. Description of the Related Art

As the result of the continuous development of new technologies, particularly in the areas of semiconductor processing, integrated circuits are becoming increasingly more complex and operate at ever faster speeds. For example, the development of semiconductor processes such as "deep submicron" processing has reduced manufacturable circuit dimensions to less than a third of a micron, making it feasible to place more than a million logic gates on a single integrated circuit. With these capabilities, memory, CPU, graphics, communications, specialized functions, etc., may be integrated onto a single chip, creating a "system on a chip." These advances in semiconductor processing have also led to the emergence of state of the art foundries whose primary expertise is the fabrication of integrated circuits. These foundries typically are not extensively involved in the chip design process and thus can devote their full attention to streamlining and further developing the fabrication process. As a result, the time required to fabricate integrated circuits has fallen steadily and is now on the order of several weeks. This, in turn, has pressured chip designers to complete their design tasks in ever shorter periods of time, resulting in shorter overall product cycles for integrated circuits. In short, advances in semiconductor processing have resulted in increasingly complex chips which must be designed in ever shorter time periods.

To meet this challenge, chip designers are increasingly relying on a hierarchical approach to designing chips. In this approach, a complex chip is segmented into a number of component circuits, each of which may be further segmented into subcomponents, and so on. For example, an integrated circuit containing a "system on a chip" is segmented into a memory component, a CPU component, a graphics component, etc. The CPU component may be further subdivided into ALU, control logic, cache, etc. Likewise, the memory component may be further subdivided into a basic memory cell which is replicated many times, control logic, etc. Dividing a complex chip into a number of simpler circuits achieves several purposes. First, the hierarchical approach provides a systematic approach to designing complex chips. Second, designing each of the components is a more manageable task than designing the entire chip at once. Third, the design time for the chip is reduced because, to some degree, all of the components may be designed in parallel.

It is also becoming increasingly popular to purchase or license some or all of these components from third parties who have previously designed the component, rather than designing the components from scratch. Such circuit components are often referred to as "IP blocks" or "IP cores," with the third party being an "IP provider." Here, "IP" stands for intellectual property. For example, in a system on a chip, the CPU component may be a RISC processor licensed from MIPS or ARM, and the memory component may be licensed from RAMBUS.

The IP approach typically results in faster design times and often also lower cost. The faster design time results because integrating an IP block into a chip typically requires less time than designing the block from scratch. The lower cost results because the IP provider typically has more expertise in his circuit specialty and so is more efficient in designing the IP block and because the cost of developing the IP block may be spread overall of the IP provider's customers rather than borne by a single organization. As a result, the IP approach is particularly suited for consumer electronics, which are typically characterized by a high degree of price sensitivity, high volumes, and short product cycles. Recent activity in developing industry standards for interconnecting IP blocks is further encouraging this type of activity.

The hierarchical approach, however, often requires the generation of models, typically a functional model and a timing model, of each of the components during the design process. The functional model describes the function of the component, such as the logic or state machine behavior of the component. The timing model describes timing aspects of the component, such as the propagation delay through the component and/or timing constraints for latches internal to the component. Each latch typically will have its own timing constraints, such as set-up and hold requirements, which must be met in order for the latch to operate properly. These models preferably are "black-box" models, meaning that the model would provide enough information to allow correct interfacing of the component with other components and to allow correct integration of the component into the chip but without disclosing the internal design of the component.

Black-box models are preferred because for most uses of these models, knowledge of the internal design of the components is not necessary and usually is undesirable. For example, in the case of an IP provider, the internal design of the component is the proprietary information which the IP provider sells. If the internal design were generally known, the IP provider's business essentially would be ended. Hence, an IP provider would like to provide functional and timing models of his IP block which provide enough information for his customer to design with the IP block but which reveal as little about the internal design as possible. In other words, he prefers a black-box model of the IP block. Furthermore, black-box models are generally simpler than models which require details of the internal design and thus have the added benefit of requiring less computational horsepower during the design process. However, generating a black-box model which abstracts the timing constraints for the latches internal to a circuit has been problematic.

In a traditional approach, the entire internal design of the component is provided, typically as a netlist, in order to allow the chip designer to determine whether the timing constraints for the internal latches are met. This, however, is problematic because the entire internal design is accessible by the chip designer which is exactly what the IP provider wishes to avoid. In addition, a complex IP block may have thousands of latches and this approach requires that the timing constraints of each latch be checked on an individual basis, which is time-consuming.

In an alternate approach, termed the "gray-box" model, a modified version of the internal design is provided for modeling purposes. The internal design is divided into regions of combinational logic and latches. Latches are connected to each other via the combinational logic regions. Each of the combinational logic regions is reduced to a black-box which models the propagation delay through the region but without any specifics regarding the internal design of the region. The gray-box model then consists of the actual latches interconnected by the black-box models of the combinational logic regions. This approach is an improvement over the traditional approach but still suffers from the basic drawbacks of the traditional approach. In particular, the gray-box model still reveals a significant amount of information about the internal design of the IP block since the clocking and placement of all latches is still apparent. In addition, the time-consuming task of checking the timing constraints for each latch on an individual basis still exists.

Thus, there is a need for a timing model which abstracts the timing constraints for latches internal to a circuit while minimizing the amount of information about the internal design of the circuit which is included in the model. There is also a need for such a timing model which further allows the timing constraints for the internal latches to be checked in a time-efficient manner.

SUMMARY OF THE INVENTION

In accordance with the present invention, a computer-implemented method for generating a clock characterization model of a digital logic circuit is implemented in a computer automated design system. The digital logic circuit includes a plurality of interconnected latches and combinational logic circuits. The method includes the following steps. Timing information for the latches and for the combinational logic circuits is received, and preferably includes propagation models for the combinational logic and both propagation models and timing constraints (such as set-up and hold requirements) for the latches. A description of a class of clock scheme for clocking the digital logic circuit is also received. The clock scheme class preferably is defined solely by the number of clocks in the clock scheme and the relative ordering of their clock edges. Clock parameters for parameterizing the clock scheme class are selected. Timing constraint expressions based on the received timing information and expressed in terms of the clock parameters are derived for signal paths between latches within the digital logic circuit. In a preferred embodiment, the timing constraint expressions are based on set-up, hold, loop, and maximum transparency requirements for transparent signal paths within the digital logic circuit. The timing constraint expressions are combined to define a region of feasible clock operation for the clock scheme class.

The present invention is particularly advantageous because the clock characterization model abstracts the timing constraints which are internal to the digital logic circuit. Thus, for example, these timing constraints may be checked by referring to the clock characterization model rather than the actual circuit design of the circuit. This preserves the propriety of the actual circuit design. In addition, the clock characterization model is simpler than other alternatives for modeling the internal timing constraints of a circuit. This results in time savings when checking the internal timing constraints for design faults.

In another aspect of the invention, a computer readable medium stores a clock characterization modeler for instructing a processor to execute the above method.

In another aspect of the invention, a method for using the clock characterization model to design a first digital logic circuit which includes a second digital logic circuit includes the following steps A clock characterization model for the second digital logic circuit is received. A trial clock scheme for the first digital logic circuit is selected and it is determined whether the trial clock scheme falls within the region of feasible clock operation defined by the clock characterization model.

BRIEF DESCRIPTION OF THE DRAWING

The invention has other advantages and features which will be more readily apparent from the following detailed description of the invention and the appended claims, when taken in conjunction with the accompanying drawing, in which:

FIG. 5 is an illustration of an example digital logic circuit 502 used to illustrate method 400;

FIG. 6 is a timing diagram of a uniform clock scheme used to illustrate method 400;

FIG. 7 is a table summarizing the analysis of circuit 502 using method 400;

FIG. 10 is a table listing minimum and maximum delays for circuit 502;

FIG. 11 is a graphical representation of the region of feasible clock operation for digital logic circuit 502;

FIG. 12 is a timing diagram of a non-uniform clock scheme used to illustrate method 400;

FIG. 13 is a table listing nomenclature; and

FIG. 14 is a table summarizing the analysis of circuit 502 using method 400.

DETAILED DESCRIPTION OF THE PREFERRED EMBODIMENTS

Figure 1:
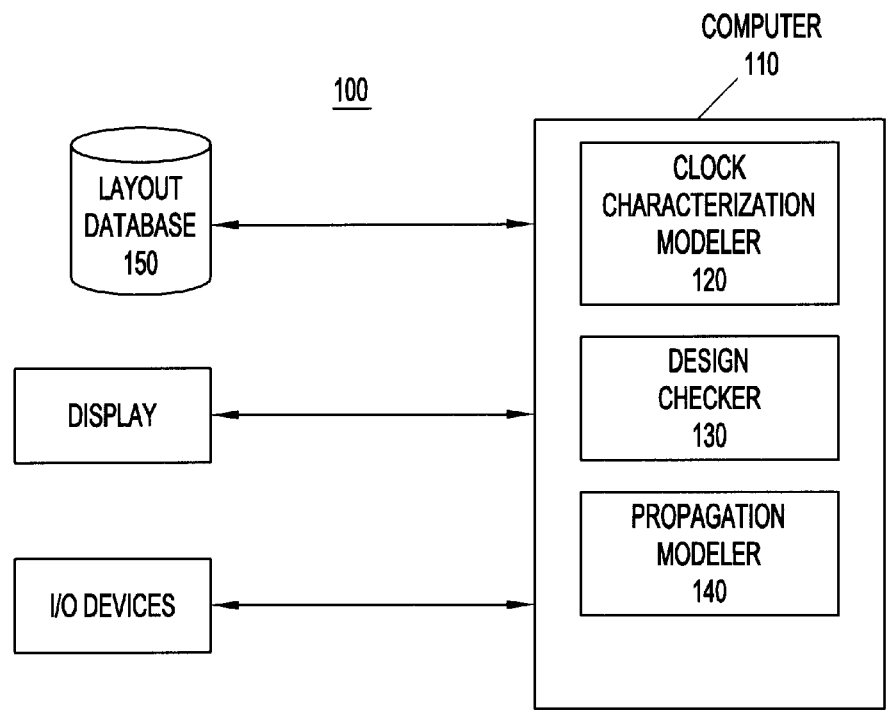
FIG. 1 is an illustration of a computer system 100 in accordance with the present invention.

FIG. 1 is an illustration of a computer system 100 in accordance with the present invention. System 100 includes a conventional computer 110 having conventional memory, display, and input-output devices. In a preferred embodiment, the computer memory contains software implementing a clock characterization modeler 120 and a design checker 130. The clock characterization modeler 120 generates a clock characterization model of a digital logic circuit in accordance with the present invention. The design checker 130 uses the clock characterization model to check for design faults when the digital logic circuit is incorporated into a larger circuit.

A propagation modeler 140 may be used in support of these components but is not necessary for operation of this invention. Operation of propagation modeler 140 is conventional. Suitable examples of propagation modeler 140 include Cadence's Virtuoso Core Characterizer table model generator, Synopsys' Core Mill Characterizer, Motive's Linear Equation modeler, and Cadence's Pearl Linear Equation modeler. The computer 110 is conventionally coupled to a mass storage device providing a layout database 150 with which the foregoing components interface. The layout database 150 preferably is implemented using the Design Framework II (dfII) layout database.

Figure 2:
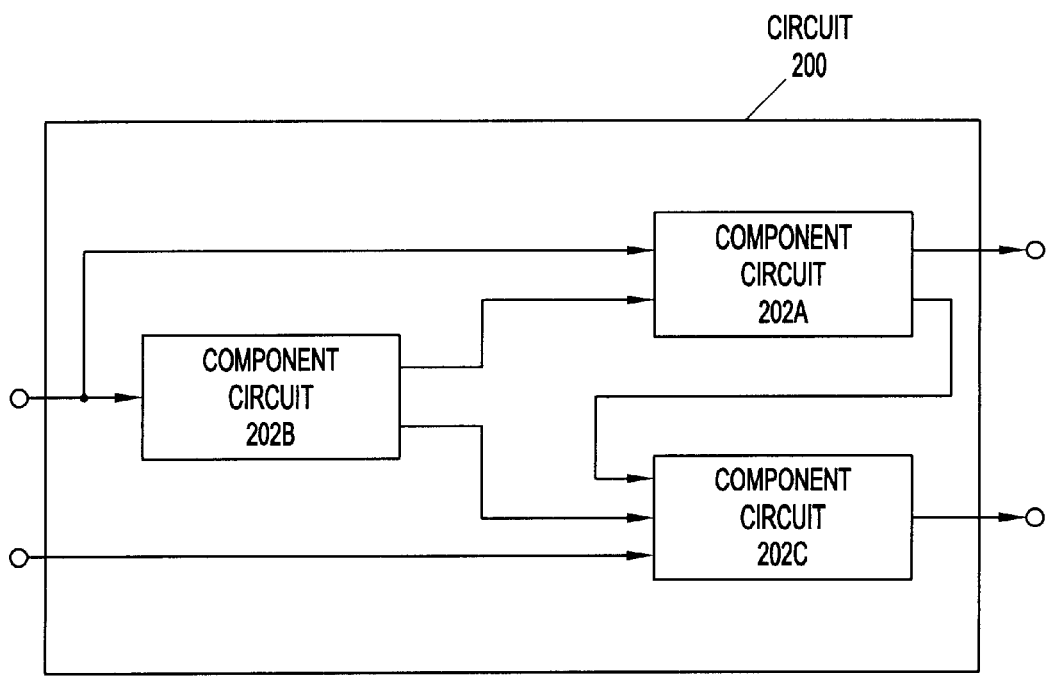
FIG. 2 is an illustration of an example digital logic circuit 200.

FIG. 2 is an illustration of an example digital logic circuit 200 for purposes of explaining the present invention. The digital logic circuit 200 includes a number of component circuits 202A–202C (collectively, 202). The component circuits 202 are interconnected to each other to form the overall circuit 200. Each component circuit 202 may include further subcomponent circuits, and so on. For purposes of clarity, the example of FIG. 2 will be limited to a single-tier hierarchy in which the component circuits 202 are not further divided into subcomponents. The invention, however, is not limited to this case.

For purposes of this invention, all of the circuitry within each component 202 may be modeled as either combinational logic or latches. A combinational logic circuit is a logic circuit which receives inputs, performs a logic function on the inputs to produce outputs, and makes the outputs available subject only to the propagation delay through the circuitry (i.e., no clocking). Examples of combinational logic include implementations of Boolean expressions and functions, such as AND, NOR, and XOR. More complex examples include circuits such as multiplexers, encoders, decoders, ALU's, and multipliers.

The term "latch" is sometimes used to refer to a specific type of memory device but will be used here to refer to all memory devices or state devices which are clocked. For clarity, this description will explain the invention in the context of latches with a single data path and three ports: a data input D, a data output Q, and a clock input C. The invention, however, is not limited to these latches and the extension to other types of latches is straightforward. In fact, for purposes of this invention, all latches may be reduced to a combination of three port latches.

Each three-port latch "opens" in response to an opening event on clock C and "closes" in response to a closing event on clock C. When the latch is open, the data input D propagates to data output Q. When the latch is closed, data output Q holds, or "remembers", its last value. The opening and closing events preferably are clock edges. Latches may be either edge-triggered or level-sensitive. In an edge-triggered latch, the input D propagates to the output Q only on a specified clock edge of clock C (either rising edge or falling edge), and the specific clock edge is both the opening and the closing event. Since a clock edge occurs essentially instantaneously, input D is gated to output Q effectively only once for each clock cycle. For all other times, the edge-triggered latch blocks the propagation of input D. Hence, edge-triggered latches will be referred to as being "opaque" or "non-transparent." In contrast, in level-sensitive latches, the input D propagates to the output Q whenever the clock C is at a certain logic level. For example, in an active high level-sensitive latch, the output Q will follow the input D for the entire time interval when the clock C is high. The opening event for such a latch is the rising edge of clock C; while the closing event is the falling edge. Since the data signal essentially flows through the latch during the entire interval when clock C takes on the appropriate logic level, level-sensitive latches will be referred to as being "transparent."

Figure 2A:
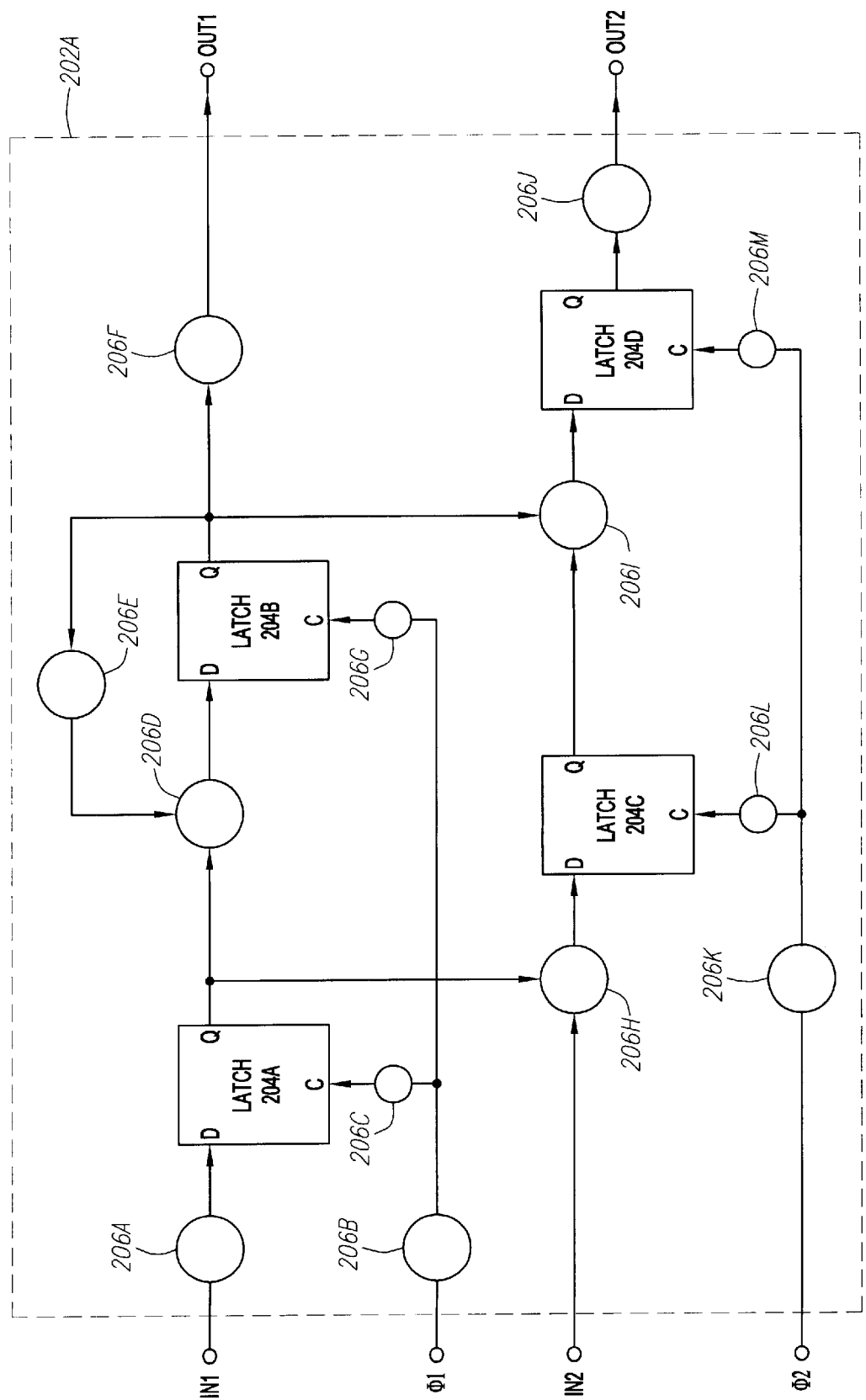
FIG. 2A is an illustration of component circuit 202A of digital logic circuit 200.

For purposes of this invention, a digital logic circuit is modeled as a set of latches interconnected by combinational logic circuits (which also include the interconnects or "wires" between latches). In FIG. 2A, the interior of component circuit 202A is shown as an example. The rectangular boxes represent latches 204A–204D; and the oval shapes 206 represent combinational logic circuits. The ports labeled In1, In2, $\phi 1$ and $\phi 2$ are input ports for circuit 202A, $\phi 1$ and $\phi 2$ being the ports which receive clocking for latches 204; while ports Out1 and Out2 are output ports. A timing model for circuit 202A generally includes models of the propagation delays for various signal paths through circuit 202A, for example from each input of circuit 202A to each output of circuit 202A. However, a timing model preferably also accounts for the timing or clocking constraints for each of the latches 204 within circuit 202A. For example, these timing constraints typically include set-up and hold requirements for each latch 204. One approach to account for these constraints is to use the model shown in FIG. 2A and individually check each of the latches 204 to determine whether the timing constraints for that latch are violated in the design for circuit 200. However, in cases where circuit 202A is large, such as a microprocessor, there may be thousands of latches 204 and individually checking the timing constraints for each latch is time-consuming. In addition, the model of FIG. 2A reveals a significant amount of detail about the internal design of circuit 202A, which is undesirable for the reasons discussed previously.

Figure 3:
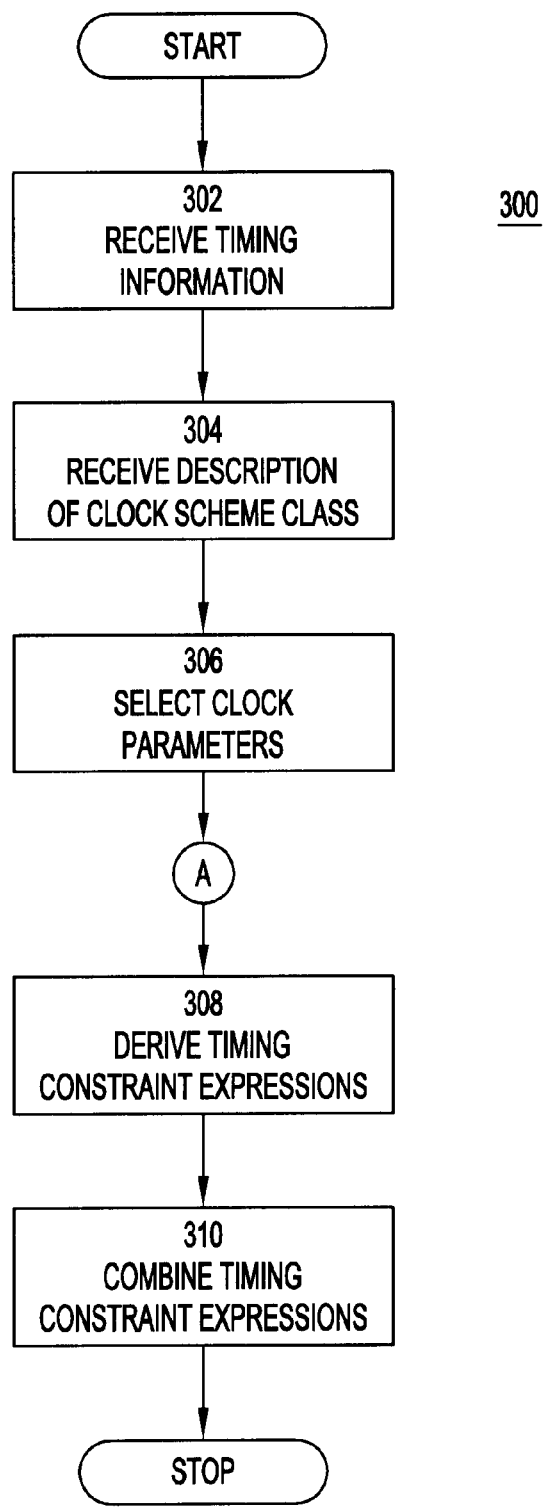
FIG. 3 is a flow diagram illustrating a method 300 for generating a timing model of a digital logic circuit in accordance with the present invention.

FIG. 3 is a flow diagram illustrating a method 300 for generating a timing model in accordance with the present invention. The timing model generated by method 300 overcomes the above drawbacks and will be referred to as a clock characterization model for reasons which will become apparent. The clock characterization model accounts for the timing constraints for latches 204 for signal paths which are internal to digital logic circuit 202A. As used in this description, the term "signal path" means a path which originates in a latch (the "source latch"), possibly traverses a number of other latches ("intermediate latches"), and terminates at a latch (the "destination latch"); and which is entirely contained within the circuit being modeled. Referring to FIG. 2A, the following are examples of signal paths: the path from latch 204A to latch 204B; the loop from 204B to 204B; and the path from 204A to 204C to 204D. Paths to or from any latch in component circuit 202B or 202C are not signals paths for circuit 202A because they are not entirely contained within circuit 202A. They would, however, be signal paths for circuit 200. The clock characterization model for circuit 202A only accounts for paths within circuit 202A because when the model is generated, it is not yet known what other circuits 202B–202C will be interfaced to circuit 202A, and the clock characterization model is intended to be general enough to be used with any other component circuits 202B–202C.

More specifically, for each signal path, data which leaves the source latch must arrive at the destination latch in a manner such that the timing constraints for the destination latch are met. The term "internal timing constraints" will be used to refer to all such timing constraints for all signal paths within a circuit 202A. The clock characterization model for a circuit 202A abstracts the internal timing constraints for the circuit 202A. In other words, the clock characterization model may be used in place of the actual implementation of circuit 202A to determine whether the internal timing constraints for circuit 202A are met.

Referring again to FIG. 3, the steps in method 300 are executed by the clock characterization modeler 120. The modeler 120 receives 302 timing information for the latches 204 and combinational logic 206 within a digital logic circuit 202A. This timing information preferably includes propagation models for the combinational logic, and both propagation models and timing constraints for the latches.

Figure 3A:
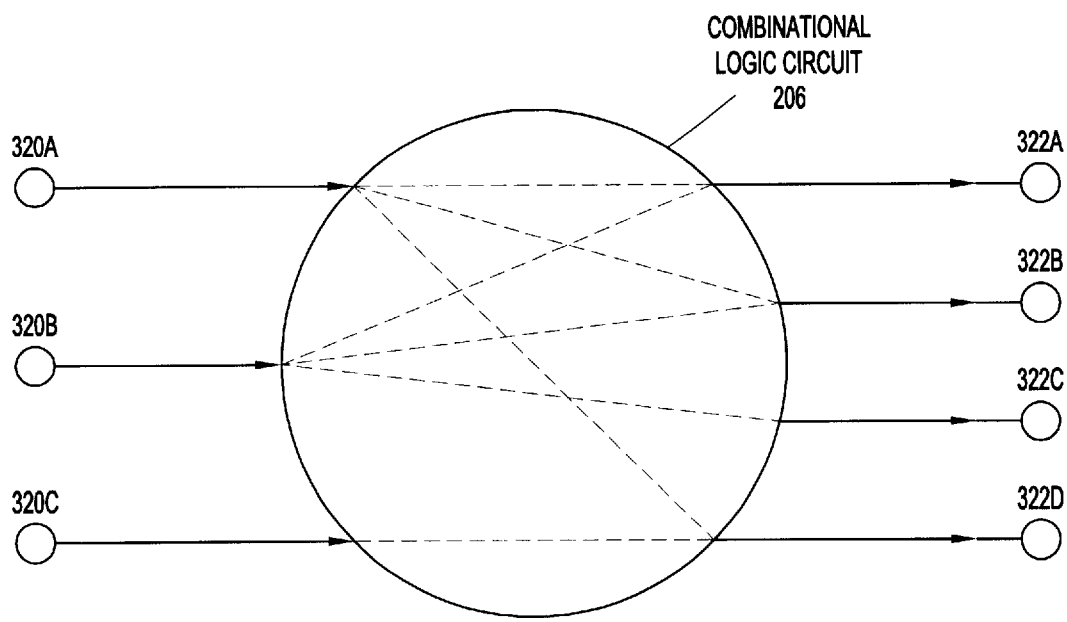
FIG. 3A is an illustration of a preferred propagation model for a combinational logic circuit 206.

FIG. 3A is an illustration of a preferred propagation model for an example combinational logic circuit 206. The physical layout of combinational circuit 206 includes a number of gates interconnected in a certain fashion. However, for purposes of generating a clock characterization model, the function of the gates is largely irrelevant and combinational circuit 206 is modeled as a set of input ports 320 and output ports 322. The propagation model for circuit 206 models the propagation delay from each input to each output. For example, in FIG. 3A, signals may propagate from input port 320A to output ports 320A, 320B, and 320D; from input 320B to outputs 322A, 322B, and 322C; and from input 320C to output 320D. The propagation model for combinational logic circuit 206 models the propagation delays along each of these paths, preferably providing both the minimum and maximum propagation delays for all combinations of rising edge and falling edge transitions on the input and output. Some of these combinations may not be possible. For example, in an AND gate, it is not possible for a falling edge on one of the inputs to generate a rising edge on the output. For these cases, the minimum and maximum delays are set to +∞ and −∞, respectively, to ensure that unsensitizable paths are discarded in the subsequent analysis. The propagation model is generated using conventional means.

It should be noted that the port-to-port paths in the propagation model generally do not have a one-to-one correspondence with the physical paths of circuit 206 since different physical paths may give rise, for example, to the minimum and maximum propagation delays along any port-to-port path for each combination of rising and falling edges at the input and output ports. For example, with respect to signals propagating from input port 320A to output port 322A, there may be many different physical paths for which a rising edge at input port 320A will result in a rising edge at output port 322A. One of these physical paths may yield the minimum propagation delay for the rising edge to rising edge transition; while a different physical path may yield the maximum propagation delay for the rising edge to rising edge transition. Furthermore, different physical paths may yield the minimum and maximum propagation delays for other types of transitions, such as a rising edge at input port 320A resulting in a falling edge at output port 322A.

Figure 3B:
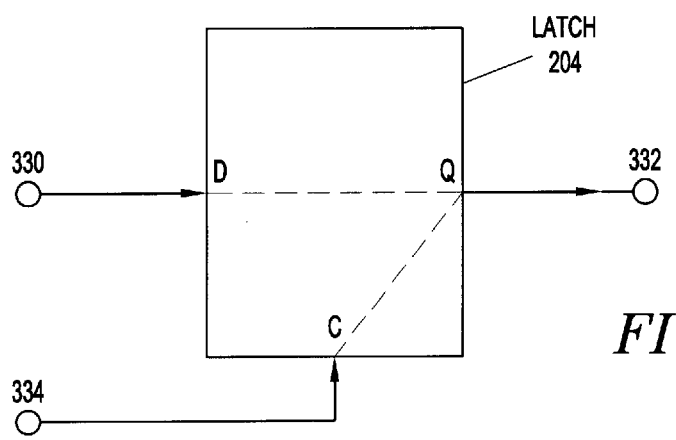
FIG. 3B is an illustration of a preferred temporal model for a latch 204.

FIG. 3B is an illustration of a preferred temporal model for a three-port latch 204, which includes both a propagation model and the timing constraints for the latch 204. Latch 204 is a three-port latch with data input D 330, data output Q 332 and a clock input C 334. As with combinational logic 206, the logic functionality of latch 204 is largely irrelevant for timing purposes. For latch 204, data input D 330 and clock input C 334 are input ports; while data output Q 332 is an output port. Accordingly, the preferred propagation model for latch 204 is a special case of the model shown in FIG. 3A and includes the propagation delays from D-to-Q and from C-to-Q.

The temporal model of FIG. 3B also includes the timing constraints for latch 204, which typically include a set-up and a hold requirement. Generally speaking, proper latch operation requires that the input data signal be stable for a sufficient amount of time before and after the closing event for the latch. These "stability" constraints are captured by the set-up and hold requirements. The set-up time S is the amount of time by which an input data signal must precede the closing event. The hold time H is the amount of time for which the input data signal must remain stable after the closing event.

In a preferred embodiment, the timing information received 302 by clock characterization modeler 120 is generated based on physical descriptions of the latches 204 and combinational logic circuits 206. More specifically, the propagation modeler 140 receives a physical description of circuit 202A, preferably including a listing of the latches 204, a listing of the combinational logic circuits 206, and a description of the interconnection of the latches 204 and combinational logic circuits 206 for digital logic circuit 202A. This information is preferably provided by layout database 150 as a netlist of digital logic circuit 202A. Common netlist formats include SPICE and Verilog. Propagation modeler 140 then generates propagation models of the latches 204 and combinational logic circuits using conventional means. A common format for these propagation models is the TLF format. The timing constraints for the latches 204 are also generated by propagation modeler 140 based on transistor level models of the latches 204. In alternate embodiments, the propagation models and timing constraints may be previously generated or based on empirical studies, and stored in layout database 150, for example, in either TLF or SDF format. Other approaches for generating propagation models and timing constraints will be apparent.

In step 304, the clock characterization modeler 120 receives 304 a description of a class of clock scheme for clocking digital logic circuit 202A. This description defines a subset (i.e., the class) of all possible clock schemes which may be applied to digital logic circuit 202A. The clock characterization model generated is applicable only to the specified clock scheme class, but modeler 120 preferably can accommodate any clock scheme class and so can generate the appropriate clock characterization model for a specific application. In a preferred embodiment, the clock scheme class is defined solely by the number of clocks to be used in the clock scheme and a relative ordering of the clock edges. Significantly, note that this specific class does not put any restrictions on time intervals (such as clock period or pulse width) within the clock scheme.

Figure 3C:
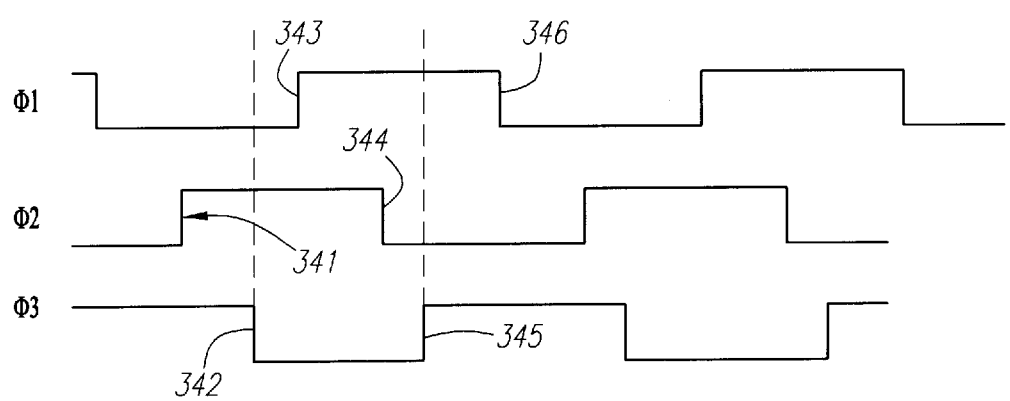
FIG. 3C is a timing diagram of an example clock scheme class.

FIG. 3C is a timing diagram of an example clock scheme class. This class includes three clocks $\phi 1$–$\phi 3$ with a common clock period $\pi$. In other words, a three-phase clocking scheme is used. In addition, the rising and falling edges of the three clocks occur in the following order: rising edge 341 of $\phi 2$, falling edge 342 of $\phi 3$, rising edge 343 of $\phi 1$, falling edge 344 of $\phi 2$, rising edge 345 of $\phi 3$, and falling edge 346 of $\phi 1$. None of the actual time intervals for the clocks are specified. Thus, for example, the actual clock period, pulse widths and duty cycles of each of the clocks $\phi 1$–$\phi 3$ is not specified for the clock scheme class of FIG. 3C.

Based on the description of the clock scheme class, the clock characterization modeler 120 selects 306 clock parameters for the clock scheme class. The selected parameters preferably are time intervals for the clock scheme class. For example, the clock scheme class of FIG. 3C has six degrees of freedom and may be parameterized using the following clock parameters: clock period π, time for rising edge to falling edge (i.e., pulse width) of each of clocks φ1–φ3, and time from rising edge 343 of φ1 to rising edge 341, 342 (i.e., relative phase shift) of each of clocks φ2 and φ3. Alternately and equivalently, the clock parameters for the clock scheme class of FIG. 3C may be the following: the clock period, duty cycle for each of the three clocks φ1–φ3, and relative phase shifts from φ1 to φ2 and from φ1 to φ3.

In step 308, the clock characterization modeler 120 derives 308 timing constraint expressions for signal paths in terms of the clock parameters. More specifically, each signal path is analyzed to ensure that data leaving the source latch satisfies the timing constraints for the destination latch. As with all timing requirements, it is preferable to take a pessimistic (i.e., worst-case) approach when formulating timing constraint expressions since any violation of a timing constraint expression may result in failure of the circuit to operate properly. However, it is also desirable to avoid being overly pessimistic as over-pessimism unnecessarily constrains the design.

In a preferred embodiment, the timing constraint expressions are derived 308 only for transparent signal paths. As defined previously, a signal path originates at a source latch and terminates at a destination latch but may also contain intermediate latches between the source and destination latches. A signal path is "transparent" if all of the intermediate latches are transparent or if there are no such intermediate latches (i.e., the signal path only contains the source and destination latches). The number of intermediate latches will be referred to as the transparency level r of the signal path. If any intermediate latches in a signal path are opaque, the signal path itself is also opaque. Modeler 120 need analyze only transparent signal paths for the following reason. Consider the signal path O1-T2-T3-O4-O5-T6-O7-T8, where On and Tn are opaque and transparent latches, respectively. This opaque signal path can be broken down into the following four transparent signal paths: O1-T2-T3-O4; O4-O5; O5-T6-O7; and O7-T8. Modeler 120 will analyze the four transparent signal paths and, because of the nature of the analysis, analysis of the opaque signal path would be redundant and so is not performed.

In addition, when analyzing transparent signal paths, data is assumed to leave the source latch upon the opening event for that latch. In other words, data is assumed to have arrived at the source latch well before the clock opening event. For certain situations, this assumption may seem overly optimistic but, in fact, it is not. For example, consider the above signal path O1-T2-T3-O4. When the transparent signal path T2-T3-O4 is analyzed, data will be assumed to leave T2 upon its opening event (e.g., rising edge if T2 is an active high level-sensitive latch). If the pessimistic case depends on determining the latest time at which the data will arrive at O4, this assumption may seem overly optimistic since data could leave T2 after the opening event and would arrive at O4 later. In fact, it might seem that the pessimistic assumption should be that data leaves T2 upon its closing event, thus yielding the latest arrival time at O4. In fact, the closing event assumption is overly pessimistic because data leaving T2 must have arrived from some other latch (O1 in this case) and, due to the other latch's timing, it might not be possible for data to leave T2 as late as the closing event. In this particular example, situations in which data leaves T2 later than its opening event are accounted for in the analysis of transparent signal path O1-T2-T3-O4, in which data is assumed to leave O1 at its opening event (which is the same as its closing event since O1 is opaque). If the data leaving from O1 arrives at T2 at some time after T2's opening event, the analysis of signal path O1-T2-T3-O4 will account for this more pessimistic situation in a manner which is not as pessimistic as simply assuming that data leaves T2 at its closing event. If not, then the opening event assumption for signal path T2-T3-O4 was not overly optimistic.

The modeler 120 combines 310 the timing constraint expressions derived in step 308 to define a region of feasible clock operation for the specified clock scheme class. This feasible region is the subset of all possible clock schemes within the clock scheme class which also satisfy all of the timing constraint expressions. The feasible region defined in terms of the clock parameters is the clock characterization model. The clock characterization model abstracts the internal timing constraints for circuit 202A because when circuit 202A is incorporated into overall circuit 200, the internal timing constraints for circuit 202A may be checked by determining whether the actual clock scheme applied to circuit 200 falls within the feasible region for circuit 202A. Significantly, this may be done without knowledge of circuit 202A's internal design since the feasible region is defined solely in terms of the clock parameters.

In a preferred embodiment, the timing constraint expressions are linear inequalities in which a linear combination of the clock parameters are compared to a constant. Furthermore, the coefficients for the clock parameters are integers. As a result of this structure, the timing constraint expressions may be combined 310 in an efficient manner using conventional techniques.

Figure 4:
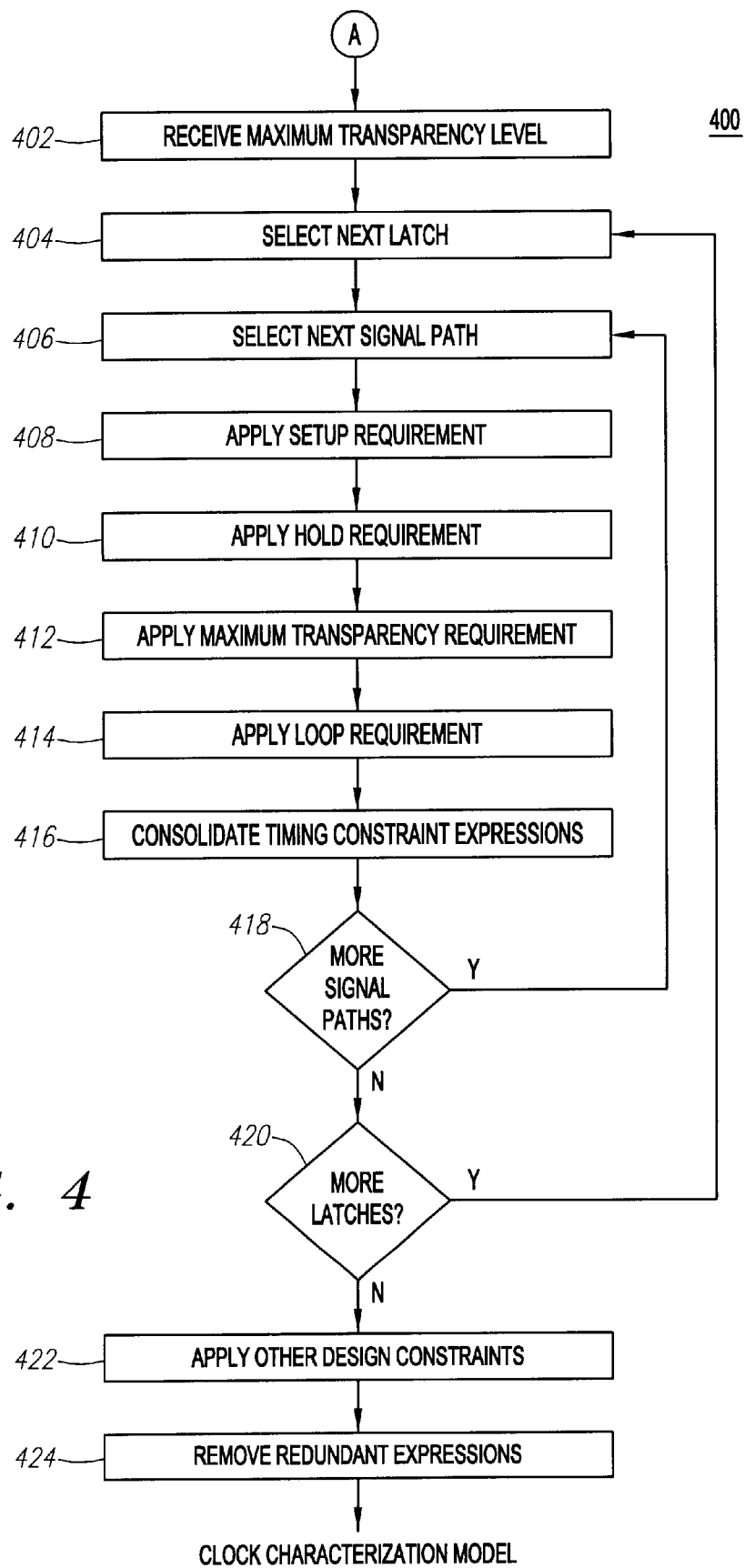
FIG. 4 is a flow diagram illustrating a preferred embodiment 400 of method 300.

FIG. 4 is a signal flow diagram illustrating a preferred embodiment 400 of method 300. More specifically, FIG. 4 illustrates a preferred embodiment of steps 308 and 310; steps 302, 304, and 306 remain the same. Method 400 is quite complex for the general case and so will be illustrated using two progressively more complex examples. The first example considers the special case when the clock scheme class is uniform clocking. In this example, a clock characterization model will be generated for the example digital logic circuit 502 of FIG. 5 and the example uniform clock scheme class of FIG. 6, with the results summarized in FIG. 7. The special case of uniform clocking vastly simplifies the steps in method 400 and allows a heuristic explanation of each of the steps. The second example considers the case of general clocking. In this example, a clock characterization model is generated for the same example digital logic circuit 502 of FIG. 5 but for the general non-uniform clock scheme class of FIG. 12, with the results summarized in FIG. 14. Because this example represents the general case, the steps in method 400 are much more complex and not as intuitive to explain.

Turning now to the uniform clocking example, in step 302, timing information for latches and combinational logic within digital logic circuit 502 is received 302. In this example, the digital logic circuit 502 includes four latches labeled O1, T1, T2 and O2. Opaque latches O1 and O2 are edge-triggered on the rising edges of clocks φ1 and φ1, respectively. Transparent latches T1 and T2 are level-sensitive on the high state of clocks φ2 and φ1, respectively. The latches are interconnected in the following manner: O1 to T1 to T2 to O2. O1 is also directly connected to T2. The latches are interconnected by combinational logic (or at least interconnects) but the symbol used in FIG. 2 is omitted for clarity.

Propagation models for the latches and combinational logic are represented by numbers within brackets, which show minimum and maximum delays in nanoseconds. For example, the notation [2, 3.5] located between O1 and T1 means that the minimum and maximum delays from the Q output of O1 to the D input of T1 are 2 and 3.5, respectively. Referring to T1, the notation [0.6, 0.8] means that the D-to-Q propagation delay for T1 ranges from of 0.6 to 0.8. Similarly, the notation [0.7, 1] means that the C-to-Q propagation delay for T1 ranges from of 0.7 to 1. Note that there are no D-to-Q delays for latches O1 and O2 since they are opaque. Finally, the term [0.2, 0.25] along the arrow from $\phi 2$ to the clock input C of T1 indicates that the propagation delay from the clock source for $\phi 2$ to the C input of T1 ranges from 0.2 to 0.25. This term is indicative of the clock skew to the C input of T1. Examples of clock sources include clock generation circuitry if the clock is generated within circuit 502 and a clock input port for clocks arriving from outside of circuit 502. For simplicity, propagation delays in this example are assumed to be constant regardless of whether the transitions are rising edge or falling edge transitions. Timing constraints for each of the latches includes a set-up and a hold requirement. For simplicity, the set-up and hold times are all equal to 0.5 in this example.

In step 304, a description of a class of clock scheme is received. The clock scheme class in FIG. 6 is selected to be uniform, non-overlapping, two-phase clocking. "Two-phase" means that the clock scheme class includes two clocks $\phi 1$ and $\phi 2$. "Non-overlapping" means that the clock edges are ordered as follows: rising edge of $\phi 1$, falling edge of $\phi 1$, rising edge of $\phi 2$, and falling edge of $\phi 2$. "Uniform" means that $\phi 1$ and $\phi 2$ have the same shape (i.e., same pulse width or duty cycle) and that the two clocks are phase-shifted by 180 degrees or half a clock period. In the general case of N-phase uniform clocking, there are N identically shaped clocks phase-shifted by $\pi/N$ where $\pi$ is the clock period.

In step 306, clock parameters are selected. In this example, because the clock scheme class is uniform, it may be described entirely by two parameters, denoted by E and w. E is the relative phase shift between $\phi 1$ and $\phi 2$, measured as a time interval. For example, E would be the time delay between the rising edge of $\phi 1$ and the next rising edge of $\phi 2$. E is also equal to one-half of the clock period $\pi$. The pulse width w is the time interval when clock $\phi 1$ is high, which is the same for both clocks since uniform clocking applies. For any type of uniform clocking, the clock scheme class may always be described entirely by the two parameters E and w, regardless of the number of clocks. This greatly simplifies the remaining steps in method 400.

In step 308 of method 300, the clock characterization modeler 120 derives timing constraint expressions for each of the transparent signal paths in circuit 502, expressing those timing constraint expressions in terms of E and w. In step 310, these timing constraint expressions are combined to define a feasible region. FIG. 4 illustrates a preferred embodiment of steps 308 and 310. The clock characterization modeler 120 receives 402 a maximum transparency level $\rho$. In method 400, rather than considering all transparent signal paths in circuit 502, the modeler 120 only analyzes those signal paths which have a transparency level $r \leq \rho$. However, if a transparent signal path has a transparency level $r = \rho$ and the signal path ends in a transparent latch, then that signal path may be the beginning of longer, transparent signal paths which will not be analyzed because their transparency level r is too large. In order to account for this possibility, a new constraint termed the "maximum transparency requirement" is added for such signal paths.

The feasible region is a function of $\rho$. At a sufficiently large value of $\rho$, all transparent signal paths will be analyzed and method 400 will result in the largest feasible region, or "true" feasible region. For circuit 502, this value is $\rho=2$. Smaller values of $\rho$ will result in more conservative, or "pessimistic," feasible regions due to use of the maximum transparency requirement. Here, "pessimistic" means that a more pessimistic feasible region will be smaller than and a subset of a less pessimistic feasible region. As a result, if a clock scheme falls within the feasible region for some value of $\rho$, it will also fall within the true feasible region, meaning that the clock scheme will not violate any internal timing constraints. Larger values of $\rho$ will yield less pessimistic feasible regions, thus allowing the selection of more aggressive clock schemes. However, they also take longer to generate the feasible region since more signal paths must be analyzed. In practice, the maximum transparency level $\rho$ is preferably set to 1, as is the case for this example.

Referring again to FIG. 4, the modeler 120 preferably analyzes circuit 502 on a latch by latch and signal path by signal path basis, as indicated by the two loops 404–420 and 406–418 in method 400. The modeler 120 first selects 404 a latch, for example latch O1. For this latch, the modeler then identifies 406 and analyzes each transparent signal path which has this latch as a source latch and has a transparency level $r \leq \rho$. In this example, the qualifying signal paths originating from O1 are O1-T1, O1-T1-T2, O1-T2, and O1-T2-O2. The transparent signal path O1-T1-T2-O2 also originates in latch O1 but has a transparency level r=2, which is greater than the selected maximum transparency level of $\rho=1$. As a result, it is not analyzed. The signal paths which are identified and analyzed in the two loops of method 400 for circuit 502 are listed in column "Signal Path" of FIG. 7.

For each of these identified transparent signal paths, the appropriate timing constraint expressions are derived. Method 400 considers four general timing constraints: set-up requirement 408, hold requirement 410, maximum transparency requirement 412, and loop requirement 414. The corresponding timing constraint expressions are derived based on the received 302 timing information and also on models for the temporal behavior of the latches. Referring again to the latch model of FIG. 3B, a preferred temporal model permits the calculation of minimum and maximum delays through the latch. This is preferably achieved by constructing models for the early and late departure times of the output data signal Q (i.e., when Q becomes available) as a function of the arrival times of the input data signal D and clock C. For reasons that will be apparent below, the early departure model assumes that the data signal D arrives well before the clock opening event and, hence, the arrival of clock C is the limiting event. Accordingly, the early departure model is Early departure time of $Q$=early arrival time of $C$+max{min{$C$-to-$Q$ delay}, min{$D$-to-$Q$ delay}} (Eqn. 1A)

where min{x,y} and max{x,y} are the minimum and maximum of x and y, respectively, and "early arrival" means the earliest time of arrival (e.g., minimum clock skew). In the late departure model, data signal D is not assumed to arrive before clock C. Hence, the departure time of Q may be limited either by the arrival of data D or the arrival of clock C. Accordingly, the late departure model is Late departure time of $Q$=max {late arrival time of $D$+max {$D$-to-$Q$ delay}, late arrival time of $C$+max {$C$-to-$Q$ delay, $D$-to-$Q$ delay}} (Eqn. 1B)

where "late arrival" means the latest time of arrival. The second term contains "max {C-to-Q delay, D-to-Q delay}"

rather than just "max {C-to-Q delay}" to account for the situation when the data signal D arrives in close temporal proximity to the opening event for clock C. The actual propagation delay in these cases tends to be somewhere between the D-to-Q and C-to-Q delays. For timing purposes, it is usually sufficient to bound the departure time by using the larger of the C-to-Q and D-to-Q delays, yielding a conservative but simple approximation for the signal departure time.

Applying Eqns. 1A and 1B yields a preferred model for the delay for a latch. In particular, if the latch is the source latch for a signal path, then min{delay for latch}=max{min{$C$-to-$Q$ delay}, min{$D$-to-$Q$ delay}} max{delay for latch}=max{max{$C$-to-$Q$ delay}, max{$D$-to-$Q$ delay}} (Eqn. 2A)

If the latch is an intermediate latch, then the delays are given by min{delay for latch}=min{$D$-to-$Q$ delay} max{delay for latch}=max{$D$-to-$Q$ delay} (Eqn. 2B)

Returning to FIG. 4, to satisfy the set-up requirement 408 for a signal path, data leaving the source latch must arrive at the destination latch early enough to meet the set-up constraint for the destination latch. As mentioned previously, data is assumed to leave the source latch upon its opening event. It is also assumed to arrive at the destination latch at the latest possible time, in order to yield a pessimistic analysis. This means that the data is assumed to experience the maximum unfavorable clock skew and the longest propagation delay. Despite this, the data must still arrive prior to the closing event for the destination latch by a time interval greater than or equal to the set-up time S for the destination latch.

For example, consider the path O1-T1. Referring to FIG. 5, the worst-case (i.e., maximum) amount of time actually required for data to propagate from O1 to T1 is given by Max actual delay=max {$C$-to-$Q$ delay for $O1$, $D$-to-$Q$ delay for $O1$}+max {delay from $O1$ to $T1$}=max {0.3, 0.5}+max{2.0, 3.5}=4.0 (Eqn. 3)

Note that the C-to-Q delay is used in the first max expression since there is no relevant D-to-Q delay for opaque latch O1. Referring to FIG. 6, the opening event for O1 is the rising edge 601 of clock φ1 and the closing event for T1 is the falling edge 604 of clock φ2. Hence, the worst-case (i.e., minimum) amount of time allotted for data to propagate from O1 to T1 is given by Min time allotted=time from edge 601 to edge 604−max {clock skew for φ1 for $O1$}+min {clock skew for φ2 for $T1$}−max {set-up time S}=$E$+$w$−max {0.1, 0.15}+min {0.2, 0.25}−max {0.5}=$E$+$w$−0.45 (Eqn. 4)

To satisfy the set-up requirement 408, the "Max actual delay" must be less than or equal to the "Min time allotted." Combining Eqns. 3 and 4 yields the timing constraint expression:

$E + w \geq 4.45$ (Eqn. 5)

as listed in the first row of the column "Timing Constraint Expression" of FIG. 7. For convenience, each of the timing constraint expressions is labeled by an "Expression ID" ranging from E1 to E14. A similar analysis yields the set-up timing constraint expressions E3, E5, E7, E8, E10, and E11 for the other transparent signal paths.

To satisfy the hold requirement 410 for a signal path, data leaving the source latch must arrive at the destination latch late enough to meet the hold constraint for the destination latch. As usual, data is assumed to leave the source latch upon its opening event. It is also assumed to arrive at the destination latch at the earliest possible time, in order to yield a pessimistic analysis. This means that the data is assumed to experience the maximum unfavorable clock skew and the shortest propagation delay. Despite this, the data must still arrive after the previous closing event for the destination latch by a time interval greater than or equal to the hold time H for the destination latch.

Because of the assumptions made, the hold requirement 401 need only be applied to transparent signal paths with a transparency level of r=0. Applying the hold requirement 401 to transparent signal paths with higher transparency levels is redundant. For example, consider the path O1-T1-T2, which has transparency level of r=1. In traveling from source latch O1 to destination latch T2, data must leave intermediate latch T1 at some time between T1's opening and closing events. However, the analysis of transparent signal path T1-T2 assumes that data leaves T1 upon its opening event, which is as pessimistic or more pessimistic than the case for signal path O1-T1-T2. Hence, if the hold requirement is satisfied for path T1-T2, it will also be satisfied for signal path O1-T1-T2 and signal path O1-T1-T2 need not be independently analyzed.

As an example of applying the hold requirement 401, consider again the path O1-T1. Referring to FIG. 5, the worst-case (i.e., minimum) amount of time actually required for data to propagate from O1 to T1 is given by Min actual delay=min {$C$-to-$Q$ delay for $O1$}+min {delay from $O1$ to $T1$}=min {0.3, 0.5}+min {2.0, 3.5}=2.3 (Eqn. 6)

Referring to FIG. 6, the opening event for O1 is the rising edge 605 of clock φ1. The closing event for data propagating from O1 to T1 is the falling edge 608 of clock φ2, so the previous closing event for T1 is the falling edge 604. Hence, the worst-case (i.e., maximum) amount of time allotted for data to propagate from O1 to T1 is given by Max time allotted=time from edge 605 to edge 604−min {clock skew for φ1 for $O1$}+max {clock skew for φ2 for $T1$ }+max {hold time $H$}=$w$−$E$−min {0.1, 0.15}+max {0.2, 0.25}+max {0.5}=$w$−$E$+0.65 (Eqn. 7)

To satisfy the hold requirement 410, the "Min actual delay" must be greater than or equal to the "Max time allotted." Combining Eqns. 6 and 7 yields the timing constraint expression:

$E - w \geq -1.65$ (Eqn. 8)

as listed in the second row of the column "Timing Constraint Expression" of FIG. 7. A similar analysis yields the hold timing constraint expressions E6, E9, and E12 for the other transparent signal paths. Note that hold timing constraint expressions are derived only for signal paths with transparency level r=0.

The maximum transparency requirement 412 is a requirement which accounts for the fact that transparent signal paths which have a transparency level r greater than the selected maximum transparency level ρ are not analyzed. In this requirement, data leaving the source latch must arrive at the destination latch early enough to meet the maximum transparency requirement. As usual, data is assumed to leave the source latch upon its opening event. It is also assumed to arrive at the destination latch at the latest possible time, in order to yield a pessimistic analysis. Despite this, the data must still arrive at or prior to the opening event for the destination latch.

The maximum transparency requirement 412 ensures that the set-up requirements for all of the unanalyzed signal paths will be met. For example, consider the path O1-T1-T2-O2. If the maximum transparency level ρ were 2 or greater, then the set-up requirement would be applied to path O1-T1-T2-O2. This would ensure that data leaving O1 upon its opening event will arrive at O2 in time to satisfy its set-up requirement. However, with a maximum transparency level of ρ=1, path O1-T1-T2-O2 is not analyzed. Instead, the maximum transparency requirement 412 is applied to path O1-T1-T2 and the set-up requirement 108 is applied to path T2-O2. The maximum transparency requirement 412 ensures that data leaving O1 upon its opening event will arrive at T2 prior to its opening event. The set-up requirement 108 ensures that data leaving T2 upon its opening event will arrive at O2 early enough to satisfy O2's set-up requirement. The two requirements together ensure that data leaving O1 upon its opening event will arrive at O2 early enough to satisfy O2's set-up requirement—which is exactly the requirement which is skipped by selecting ρ=1.

Continuing this example of applying the maximum transparency requirement 412 to O1-T1-T2 and referring to FIG. 5, the worst-case (i.e., maximum) amount of time actually required for data to propagate from O1 to T2 is given by Max actual delay=max{C-to-Q delay for O1}+max {delay from O1 to T2}=max {0.3, 0.5}+max {2.0+0.6+2.4−(1.0−0.8), 3.5+ 0.8+4.5−(1.0−0.8)}=9.1   (Eqn. 9)

The term "−(1.0−0.8)" in the second max expression accounts for differences in the C-to-Q and D-to-Q delays for destination latch T2, which is preferable since this expression is used for a maximum transparency requirement rather than a set-up or hold requirement. Including this term results in a more realistic approximation of the set-up requirement for unanalyzed path O1-T1-T2-O2 when the maximum transparency requirement for path O1-T1-T2 is combined with the set-up requirement for path T2-O2. Referring to FIG. 6, the opening event for O1 is the rising edge 601 of clock φ1, the opening event for intermediate latch T1 is the rising edge 603 of clock φ2, and the opening event for T2 is the rising edge 605 of clock φ1. Hence, the worst-case (i.e., minimum) amount of time allotted for data to propagate from O1 to T2 is given by Min time allotted=time from edge 601 to edge 605−max {clock skew for φ1 for O1}+max {clock skew for φ1 for T2}=2E− max {0.1, 0.15}+max {0.15, 0.2}=2E+0.05   (Eqn. 10)

Again, "max {clock skew for φ1 for T2}" is used rather than "min {clock skew for φ1 for T2}" because this expression is used for a maximum transparency requirement rather than a set-up or hold requirement. To satisfy the maximum transparency requirement 412, the "Max actual delay" must be less than or equal to the "Min time allotted." Combining Eqns. 9 and 10 yields the timing constraint expression:

$E \geq 4.525$   (Eqn. 11)

as listed as expression E4 in FIG. 7.

Figures 8, 9:
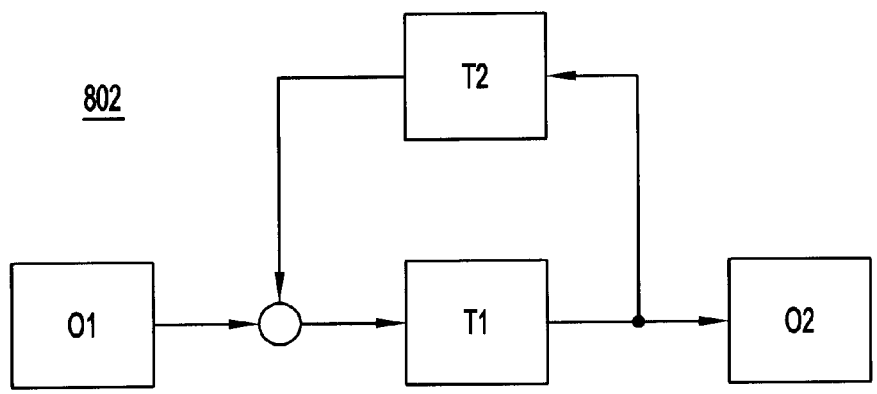
FIG. 8 is an illustration of a second example circuit 802 used to illustrate method 400.
FIG. 9 is a table listing the timing constraints applied to example circuit 802.

The loop requirement 414 is a special case of the maximum transparency requirement 412 and will be illustrated with reference to FIG. 8 since example circuit 502 does not contain any loops. FIG. 8 is an illustration of an example digital logic circuit 802 including four latches labeled O1, T1, T2 and O2. Latches O1 and O2 are edge-triggered while latches T1 and T2 are transparent. The latches are interconnected in the following manner: O1 to T1 to O2. An output of T1 is also connected to an input of T2, and an output of T2 to an input of T1. T1 and T2 form a "loop" because data may flow in a circular path through T1 and T2. Note that all latches in a loop must be transparent. For example, if T1 were opaque, T1 and T2 would not form a loop.

When a loop is formed, an infinite number of transparent signal paths containing the loop are possible. For example, data may leave T1 and flow around the loop T1-T2 any number of times, yielding any number of transparent signal paths. As another example, data may leave O1, enter and flow around the loop any number of times, and then exit the loop to O2. These loops may be accounted for by applying the set-up, hold, and maximum transparency requirements as described above. Thus, for example, if the maximum transparency level ρ=2, then analysis of circuit 802 would result in application of the timing requirements as shown in the three columns under the heading "Timing Requirements without Loop Requirement" of FIG. 9. For example, the "X" under column "Hold" for row "O1-T1" means that the hold requirement would be applied to signal path O1-T1.

Applying the loop requirement, however, results in a different set of timing requirements to be applied, as shown in the four columns under the heading "Timing Requirements with Loop Requirement" of FIG. 9. In particular, the loop requirement imposes the same timing requirement as the maximum transparency requirement but is applied to a different set of signal paths: those which end in a loop. Thus, in circuit 802, the loop requirement is applied to paths O1-T1-T2-T1, T1-T2-T1, and T2-T1-T2. Note that loops are not required to have a transparency level r equal to the maximum transparency level ρ. Application of the loop requirement makes certain set-up and maximum transparency level requirements redundant. In particular, if a signal path contains a loop, the maximum transparency level requirement need not also be applied to that path (e.g., paths O1-T1-T2-T1, T1-T2-T1-T2, and T2-T1-T2-T1). In addition, if a signal path contains a loop but does not end in the same loop, then the set-up requirement also need not be applied to that path (e.g., paths T1-T2-T1-T2, T1-T2-T1-O2 and T2-T1-T2-T1).

Returning to the example of FIGS. 5–6, FIG. 10 tabulates the minimum and maximum delays for each of the signal paths of FIG. 7. Applying the timing constraint expressions illustrated above to the example of FIGS. 5–6 results in the timing constraint expressions listed in column "Timing Constraint Expressions" of FIG. 7. The column "Constraint" identifies which of the above four requirements resulted in the corresponding timing constraint expression. For convenience, the expressions are assigned reference labels En, as indicated in column "Expression ID". The expressions E1–E12 are listed in the chronological order in which they are generated in this example, following the two loops of method 400.

In step 416, modeler 120 consolidates newly generated timing constraint expressions with previously derived timing constraint expressions. Note that the timing constraint expressions are all linear inequalities in which a linear combination of the clock parameters is compared to a constant. In consolidation step 416, linear equalities which contain the same linear combination of clock parameters are combined into a single linear inequality. For example, after the first three paths have been analyzed, the expressions E1–E6 will have been generated. Analysis of the fourth path then yields expression E7, which is E≧9.325. Expression E7, however, has the same linear combination of clock parameters (i.e., left-hand side) as expression E4, which is E≧4.525. Since E7 is more restrictive, the two expressions are consolidated 416 by retaining E7 and dropping E4. This is noted by the comment "Consolidated into E7" under the heading "Disposition" for expression E4.

The linear inequalities are preferably stored in a manner which facilitates consolidation 416. For example, in this preferred embodiment, the coefficients for the linear combinations of clock parameters will be integers. Thus, they can be used as indices into an array, with the corresponding array value equal to the constant being compared to. For example, if the array is named "A," then E1, which is E+w≧4.45, may be stored by setting A(1,1)=4.45, where the first 1 indicates the coefficient for E and the second 1 indicates the coefficient for w. E2 would be stored by setting A(1,-1)=-1.65; E3 by setting A(2,1)=9.8, and so on. Hence, a new expression may be consolidated by examining the contents of the array element indexed by the coefficients of the new expression.

Expression E12 is always true and so may be dropped. If a false expression had been generated during the analysis, then the feasible region generated for the chosen value of ρ would be the null set. There are two possibilities. Either a larger value of ρ is required to achieve a less pessimistic feasible region or the feasible region truly is the null set, meaning that no clock schemes within the clock scheme class meet the internal timing constraints.

In addition to requirements 408, 410, 412 and 414, additional design constraints may also be applied 422 to derive other constraint expressions in terms of the clock parameters. For example, there may be constraints on the minimum pulse width or minimum separation between clock edges, on other time intervals in the clock scheme class, and so on. In this particular example, clock edges are required to be separated by at least 0.1, resulting in expressions E13 and E14.

Combining the constraint expressions resulting from the internal timing constraints and other design constraints results in a system of constraint expressions which are linear inequalities in this specific example. Modeler 122 removes 424 any redundant inequalities. For example, after consolidation 416, which is a special case of removing redundancies, the system of linear inequalities includes expressions E3, E5, E6, E7, E8, and E14. FIG. 11 is a graphical representation of these inequalities. Each of the labeled lines represents one of the inequalities generated by method 400. The hashed region 1000 is the region which satisfies all of these inequalities. Note that the hashed region is defined by only three of the six expressions graphed in FIG. 11. Expressions E3, E6 and E8 are redundant and removed 424 by modeler 122, as indicated by "Redundant" in the column "Disposition" of FIG. 7. Modeler 120 preferably achieves this by using conventional techniques. The remaining expressions E5, E7, and E14 define the hashed region 1000 or feasible region for circuit 502. If a clock scheme within the selected clock scheme class falls within the feasible region, then it will not violate any of the internal timing constraints for circuit 502.

To use this clock characterization model, a chip designer who has selected a trial clock scheme within the clock scheme class and with specific values of E and w for a particular use of circuit 502 need only determine whether those values fall within the feasible region 1000. This preferably is done automatically by design checker 130. In addition, the design check is completed without revealing the internal design of circuit 502 and is completed much more quickly than, for example, individually checking each latch. In this example, the internal timing constraints for simple circuit 502 were reduced to three linear inequalities for the selected clock scheme class. Also note that the selected clock scheme class in this example is limited to the ordering of clock edges shown in FIG. 6 or, equivalently, a cyclical shift of this ordering.

Similar, if not more significant, reductions are expected for larger circuits. For example, method 400 was applied to a large latch-based design from a major semiconductor company. The design contained approximately 8000 transistors, 4400 nets, 187 latches, and more than 40,000 internal timing constraints. Method 400 required two and a half minutes to complete on an HP715 with 128 MB of memory and a 1 GB hard drive. The resulting feasible region was defined by three inequalities.

As an added advantage, the clock characterization model also enables other approaches to designing circuits. For example, if a designer is looking for the clock scheme with the minimum period, this would be equivalent to looking for the point in the feasible region 1000 which has the smallest value of E, since the clock period is equal to 2E. In FIG. 11, the minimum value of E is given by expression E7: E≧9.325. Hence, the minimum period is 2E=18.65 ns. Furthermore, for this value of E, w is constrained by expressions E5 and E14 to the region 8.5≦w≦9.225, meaning that the duty cycle for the minimum period clock scheme can only range between approximately 45% and 50%.

FIGS. 12–14 will now be used to illustrate the second example—that of non-uniform clocking. This example will build on the heuristics introduced by the uniform clocking case, but the end result will be a general approach which can be used with any type of clocking based on a common clock period. As will be apparent, the non-uniform case is much more complex than the uniform clocking case. However, it is also significantly more important since it represents the general formulation for the clock characterization model and since many real-world applications rely on non-uniform clocking. Even circuits which are designed to use uniform clocking typically will benefit from a general clocking analysis since slight imperfections in manufacturing and/or simulation may quickly degrade a uniform clocking scheme into a non-uniform one, thus requiring the general analysis.

The primary purpose of the uniform clocking example described previously was to introduce the general principles for the non-uniform clocking case in a comprehensible manner. These principles will now be extended to the general case in the following example. In particular, methods 300 and 400 are generally applicable to the non-uniform case, although the specific implementation of various steps within each method will differ between the uniform and non-uniform cases. The definition and parameterization of the clock scheme class (steps 304 and 306) and the generation of timing constraint expressions from timing requirements (steps 408, 410, 412, and 414) are the steps which vary the most significantly between the two cases. These differences will be highlighted by repeating the analysis of example circuit 502 but using the non-uniform clock scheme class shown in FIG. 12.

Method 400 begins by receiving 302 timing information about the circuit 502 to be analyzed. This step is not significantly different for the non-uniform case.

In step 304, a description of a class of clock scheme is received. The clock scheme class in FIG. 12 includes two clocks $\phi1$ and $\phi2$ of the same period $\pi$. In this particular example, the clock edges are ordered as follows: rising edge 1201 of φ1, falling edge 1202 of φ1, rising edge 1203 of φ2, and falling edge 1204 of φ2. Since this is the general case, there are no further constraints on the clock scheme class. In particular, clocks φ1 and φ2 are not required to have the same duty cycle, as was the case for uniform clocking.

In step 306, clock parameters are selected. In the uniform case, the clock scheme class could always be described entirely by two parameters regardless of the number of clocks. In the general case, a clock scheme class with N clocks will typically require 2N independent parameters to fully describe the class. For example, the specific class shown in FIG. 12 may be described by the following four parameters: the period of the clocks denoted by $\pi$, the pulse width of clock φ1 denoted by w1, the pulse width of clock φ2 denoted by w2, and the relative phase shift between φ1 and φ2 denoted by E12. For convenience, the timing constraint expressions will typically be expressed initially as time intervals between clock edges, each of which in turn may be expressed as a function of the selected parameters. For example, $E[\phi 1\uparrow, \phi 1\downarrow]$ is the time interval between the rising edge 1201 and falling edge 1202 of clock φ1 and is equal to w1. $E[\phi 1\downarrow, \phi 2\downarrow]$ is the time interval between the falling edge 1202 of clock φ1 and the falling edge 1204 of clock φ2 and is equal to (E12+w2−w1) for the specific class shown in FIG. 12. Note that these two examples assume that the two clock edges in question fall within a single clock period of each other. This is preferable since most circuit designers intend for timing decisions to occur within a single clock period. However, if more than one clock period is required, then multiples of $\pi$ may be added to the relevant quantities. For example, if $E[\phi 1\uparrow, \phi 1\downarrow]$ is the time interval between the rising edge 1201 and falling edge 1206 of clock φ1, then it will be equal to w1+$\pi$ for the class shown in FIG. 12.

In method 400, the clock characterization modeler 120 receives 402 a maximum transparency level $\rho$, which has the same significance as in the uniform case. Clock characterization modeler 120 preferably analyzes the relevant signal paths on a latch by latch and signal path by signal path basis, as indicated by the two loops 404–420 and 406–418. For each of the transparent signal paths to be analyzed, the appropriate timing constraint expressions are derived.

In method 400, there are four general timing constraints which may be applied to any transparent signal path: set-up requirement 408, hold requirement 410, maximum transparency requirement 412, and loop requirement 414. These four constraints will be explained below for the non-uniform case using the nomenclature of FIG. 13. The transparent signal path P being analyzed is assumed to have a transparency level of r and the latches in path P are numbered from i=0 (the source latch) to i=r+1 (the destination latch).

In the general non-uniform clocking case, a preferred embodiment of the set-up requirement 408 for a signal path is described by the equation $\pi - E[c(0), o(0)] + \Sigma E[c(k), c(k+1)] \geq [Qo(0) - qc(r+1)] +$ max $\{\Delta R(0) + \Delta RR(0,r+1) + SR(r+1), \Delta F(0) + \Delta FR(0,R+1) + SR(r+1),$ $\Delta F(0) + \Delta FF(0,R+1) + SF(r-1), \Delta R(0) + \Delta RF(0,R+1) + SF(r+1)\}$ (Eqn. 12)

where the summation is over k=0 to r, $\Delta R(0) = \max \{\Delta RR(0,D), \Delta FR(0,D), \Delta R(0,C)\}$, and $\Delta F(0) = \max \{\Delta RF(0,D), \Delta FF(0,D), \Delta F(0,C)\}$.

Equation 12 is roughly explained as follows. As described previously, the set-up requirement 408 generally requires that even in a worst case of maximum delay, data must arrive at the destination latch prior to the closing event for the destination latch by a time interval greater than or equal to the set-up time S for the destination latch. The left-hand side is the amount of time allotted for signal propagation from the opening event of the source latch to the closing event of the destination latch. The right-hand side is the worst case actual time required to propagate from the source latch (latch 0) to the destination latch (latch r) plus set-up time, which must be less than or equal to the time allotted for propagation to satisfy the set-up requirement. On the right-hand side, the term "[Qo(0)−qc(r+1)]" represents the worst case clock skew (i.e., clock for source latch experiences maximum delay while clock for destination latch experiences minimum delay). The remaining term represents the maximum value of (propagation delay+set-up time). Note that this term is the maximum value of four distinct possibilities, each corresponding to different combinations of rising and falling edges for data leaving the source latch and arriving at the destination latch.

It should be noted that all $\delta$ and $\Delta$ quantities generally are structured similarly. For example, consider the path O1-T1-T2 of FIG. 7 which involves only one intermediate latch. There may actually be many different physical paths for signals to travel from latch O1 to T1 to T2. These all must be considered in determining the various $\Delta$ quantities for this path. In addition, even if there were only a single physical path corresponding to this path, that one signal path must be considered for all combinations of rising and falling edges at each of the latch inputs and outputs. For example, the quantity "$\Delta RR(0,2)$" for path O1-T1-T2 is the maximum propagation delay for a rising edge at the output of O1 which results in a rising edge at the input of T2. However, there are four possible ways in which this might occur: (i) rising edge at O1 output results in rising edge at T1 input results in rising edge at T1 output results in rising edge at T2 input, (ii) rising edge at O1 output results in rising edge at T1 input results in falling edge at T1 output results in rising edge at T2 input, (iii) rising edge at O1 output results in falling edge at T1 input results in rising edge at T1 output results in rising edge at T2 input, and (iv) rising edge at O1 output results in falling edge at T1 input results in falling edge at T1 output results in rising edge at T2 input. Furthermore, there may be multiple physical paths corresponding to each of the four combinations. The term "$\Delta RR(0,2)$" represents the maximum among all of these possibilities. As a result, it is preferable to select low values of $\rho$ since this leads to short signal paths and significantly reduces the number of physical paths and rising edge/falling edge combinations which must be considered.

The hold requirement 410 for the general case is preferably given by the equation $E[c(0), c(1)] - E[c(0), o(0)] \leq [qo(0) - Qc(1)] + \min \{(\delta R(0) + \delta RR(0,1)) - HR(1), (\delta F(0) + \delta FR(0,1)) - HR(1), (\delta F(0) + \delta FF(0,1)) - HF(1), (\delta R(0) + \delta RF(0,1)) - HF(1)\}$, (Eqn. 13)

where $\delta R(0) = \max \{\min\{\delta RR(0,D), \delta FR(0,D)\}, \delta R(0,C)\}$, and $\delta F(0) = \max \{\min\{\delta RF(0,D), \delta FF(0,D)\}, \delta F(0,C)\}$.

In an alternate, more optimistic embodiment (perhaps too optimistic for some situations), $\delta R(0) = \max \{\delta RR(0,D), \delta FR$ (0,D), δR(0,C)} and δF(0)=max {δRF(0,D), δFF(0,D), δF(0, C)}. Equation 13 is roughly explained as follows. As described previously, the hold requirement 410 generally requires that even in a worst case of minimum delay, data must arrive at the destination latch after the previous closing event for the destination latch by a time interval greater than or equal to the hold time S for the destination latch. The left-hand side is the amount of time allotted for signal propagation from the opening event of the source latch to the previous closing event of the destination latch. The right-hand side is the worst case actual time required to propagate from the source latch (latch 0) to the destination latch (latch 1) minus hold time, which must be greater than or equal to the time allotted for propagation to satisfy the hold requirement. On the right-hand side, the term "[qo(0)−Qc(1)]" represents the worst case clock skew. The remaining term represents the maximum value of (propagation delay–hold time). Multiplying both sides by −1 yields $$E[c(0),o(0)]-E[c(0),c(1)] \geq [Qc(1)-qo(0)] + \max \{HR(1)-(\delta R(0)+\delta RR(0,1)), HR(1)-(\delta F(0)+\delta FR(0,1)), HF(1)-(\delta F(0)+\delta FF(0,1)), HF(1)-(\delta R(0)+\delta RF(0,1))\}, \quad \text{(Eqn. 14)}$$

where $$\delta R(0) = \max \{\min\{\delta RR(0,D), \delta FR(0,D)\}, \delta R(0,C)\},$$

and $$\delta F(0) = \max \{\min\{\delta RF(0,D), \delta FF(0,D)\}, \delta F(0,C)\}.$$

As with equation 13, the alternate expressions for δR(0) and δF(0) may be used. Equation 14 is preferable because in this form, a linear combination of time intervals (i.e., the E[ ] quantities) is greater than or equal to a constant. This is the same general form as the set-up requirement of equation 12 and therefore allows more efficient consolidation of the resulting timing constraint expressions.

The maximum transparency requirement 412 is preferably described by the equation $$E[c(r+1),o(r+1)]-E[c(0),o(0)] + \Sigma E[c(k),c(k+1)] \geq [Qo(0)-Qo(r+1)]$$

$$+ \max \{\Delta R(0) + \Delta RR(0,r+1) - \Gamma R(r+1), \Delta F(0) + \Delta FR(0,r+1) - \Gamma R(r+1),$$

$$\Delta F(0) + \Delta FF(0,r+1) - \Gamma F(r+1), \Delta R(0) + \Delta RF(0,r+1) - \Gamma F(r+1)\} \quad \text{(Eqn. 15)}$$

where the summation is over k=0 to r $$\Delta R(0) = \max \{\Delta RR(0,D), \Delta FR(0,D), \Delta R(0,C)\},$$

$$\Delta F(0) = \max \{\Delta RF(0,D), \Delta FF(0,D), \Delta F(0,C)\},$$

$$\Gamma R(r+1) = \min \{\Delta R(r+1) - \Delta RR(r+1,D), \Delta F(r+1) - \Delta RF(r+1,D)\}$$

$$\Gamma F(r+1) = \min \{\Delta F(r+1) - \Delta FF(r+1,D), \Delta R(r+1) - \Delta FR(r+1,D)\}$$

$$\Delta R(r+1) = \max \{\delta RR(r+1,D), \delta FR(r+1,D), \delta R(r+1,C)\},$$

and $$\Delta F(r+1) = \max \{\delta RR(r+1,D), \delta FF(r+1,D), \delta F(r+1,C)\},$$

Equation 15 is roughly explained as follows. The maximum transparency requirement 410 generally requires that for signal paths which have a transparency level r=ρ and which end in a transparent latch, even in a worst case of maximum delay, data must arrive at the destination latch prior to the opening event for the destination latch, with some adjustments. The left-hand side is the amount of time allotted for signal propagation from the opening event of the source latch to the opening event of the destination latch. The right-hand side is the worst case actual time required to propagate from the source latch to the destination latch, which must be greater than or equal to the time allotted for propagation to satisfy the hold requirement. On the right-hand side, the term "[Qo(0)−Qo(r+1)]" represents the worst case clock skew.

The loop requirement 414 is a special case of the maximum transparency requirement and so is also preferably described by Equation 15. As in the uniform clocking case, if loops are present, application of the loop requirement 414 will make some of the set-up and maximum transparency requirements redundant.

Applying the timing constraint expression of equations 12, 14, and 15 above to the example of FIGS. 5 and 12 results in the timing constraint expressions listed in column "Timing Constraint Expressions" of FIG. 14, which are listed in the chronological order in which they are generated in this example, following the two loops of method 400. FIG. 14 uses the same format as FIG. 7 to facilitate comparison of the uniform and non-uniform cases and also includes any additional design constraints 422. In this particular example, all clock edges are required to be separated by at least 0.1. Modeler 120 consolidates 416 newly generated timing constraint expressions with previously derived timing constraint expressions and also removes 424 any redundant inequalities, resulting in a description of a feasible region for the selected class of clock schemes (i.e., the ordering of clock edges shown in FIG. 12).

Although the invention has been described in considerable detail with reference to certain preferred embodiments thereof, other embodiments are possible. For example, the timing constraint expressions of Eqns. 12, 14, and 15 are based on certain assumptions and models; other embodiments may be based on different assumptions and/or models resulting in different timing constraint expressions. Therefore, the scope of the appended claims should not be limited to the description of the preferred embodiments contained herein.

What is claimed is:

1. In a computer automated design system for designing digital logic circuits, a computer-implemented method for generating and using a clock characterization model of a digital logic circuit comprising a plurality of interconnected latches and combinational circuits, the method comprising:

receiving timing information for the latches and for the combinational logic circuits;

receiving a description of a class of clock scheme for clocking the digital logic circuit;

selecting clock parameters for parameterizing the clock scheme class;

based on the received timing information, deriving timing constraint expressions for signal paths between latches in terms of the clock parameters; and combining the timing constraint expressions to define a region of feasible clock operation, for the clock scheme class, that defines a range of said clock parameters that is consistent with said timing information for said latches and said clock scheme;

testing feasibility of using said digital logic circuit connected to a host circuit by comparing ranges of clocking allowed for said host circuit with said region of feasible clock operation.

2. The method of claim 1, wherein the received timing information comprises:

propagation models for the combinational logic circuits and for the latches; and timing constraints for the latches.

3. The method of claim 1, wherein the step of receiving timing information for the latches and for the combinational logic circuits comprises:
  receiving a physical description of the digital logic circuit, the description including:
    a listing of the latches in the digital logic circuit,
    a listing of the combinational logic circuits in the digital logic circuit, and
    a description of the interconnection of the latches and combinational logic circuits within the digital logic circuit; and
  generating the timing information for the latches and for the combinational logic circuits based on the received physical description.

4. The method of claim 1, wherein the description of the class of clock scheme comprises:
  a number of clocks in the clock scheme class; and
  a relative ordering of the clock edges of the clocks.

5. The method of claim 1, wherein the clock scheme class consists of:
  uniform clock schemes.

6. The method of claim 1, wherein the clock scheme class comprises:
  non-uniform clock schemes.

7. The method of claim 1, wherein the clock parameters comprise:
  time intervals of the clocks.

8. The method of claim 1, wherein the step of deriving timing constraint expressions comprises:
  identifying transparent signal paths, wherein each transparent signal path originates at a source latch and terminates at a destination latch; and
  for each identified transparent signal path, deriving timing constraint expressions applicable to that transparent signal path in terms of the clock parameters.

9. The method of claim 8 wherein the step of deriving timing constraint expressions applicable to each identified transparent signal path in terms of the clock parameters comprises:
  deriving a timing constraint expression based on a set-up requirement for the destination latch.

10. The method of claim 9, wherein the step of deriving a timing constraint expression based on a set-up requirement for the destination latch comprises:
  assuming that data arrives at the destination latch at a latest possible time consistent with the data leaving the source latch upon an opening event for the source latch; and
  requiring the data to arrive at the destination latch prior to a closing event for the destination latch by a time interval greater than a set-up time for the destination latch.

11. The method of claim 8, wherein the step of deriving timing constraint expressions applicable to each identified transparent signal path in terms of the clock parameters comprises:
  when the identified transparent signal path has a transparency level of zero, deriving a timing constraint expression based on a hold requirement for the destination latch.

12. The method of claim 11, wherein the step of deriving a timing constraint expression based on a hold requirement for the destination latch comprises:
  assuming that data arrives at the destination latch at an earliest possible time consistent with the data leaving the source latch upon an opening event for the source latch; and
  requiring the data to arrive at the destination latch after the previous closing event for the destination latch by a time interval greater than a hold time for the destination latch.

13. The method of claim 8, wherein the step of deriving timing constraint expressions applicable to each identified transparent signal path in terms of the clock parameters comprises:
  when the identified transparent signal path ends in a loop, deriving a timing constraint expression based on a loop requirement for the identified transparent signal path.

14. The method of claim 13, wherein the step of deriving a timing constraint expression based on a loop requirement comprises:
  assuming the data arrives at the destination latch at a latest possible time consistent with the data leaving the source latch upon an opening event for the source latch; and
  requiring the data to arrive at the destination latch prior to an opening event for the destination latch.

15. The method of claim 8, wherein:
  the method further comprises receiving a maximum transparency level;
  the step of deriving timing constraint expressions applicable to each identified transparent signal path in terms of the clock parameters comprises, when the identified transparent signal path has a transparency level equal to the maximum transparency level and the destination latch is transparent, deriving a timing constraint expression based on a maximum transparency requirement for the identified transparent signal path.

16. The method of claim 15, wherein the step of deriving a timing constraint expression based on a maximum transparency requirement comprises:
  assuming that data arrives at the destination latch at a latest possible time consistent with the data leaving the source latch upon an opening event for the source latch; and
  requiring the data to arrive at the destination latch prior to an opening event for the destination latch.

17. The method of claim 1, wherein the step of combining the timing constraint expressions to define a region of feasible clock operation comprises:
  expressing the timing constraint expressions as linear inequalities in which a linear combination of the clock parameters is compared to a constant; and
  combining all linear inequalities which contain a same linear combination of the clock parameters into a single linear inequality.

18. The method of claim 1, wherein the step of combining the timing constraint expressions to define a region of feasible clock operation comprises:
  eliminating redundant timing constraint expressions.

19. The method of claim 1, further comprising:
  receiving other design constraints for the digital logic circuit;
  based on the received other design constraints, deriving other constraint expressions in terms of the clock parameters; and
  combining the other constraint expressions and the timing constraint expressions to define a region of feasible clock operation for the clock scheme class.

20. The method of claim 19, wherein the other design constraints comprise:
  constraints on the time intervals of clocks in the clock scheme class.

21. In a computer automated design system for designing digital logic circuits, a computer-implemented method for generating and using a clock characterization model of a digital logic circuit comprising a plurality of interconnected latches and combinational circuits, the method comprising:
  receiving timing information for the latches and for the combinational logic circuits;
  receiving a description of a class of clock scheme for clocking the digital circuit;
  selecting clock parameters for parameterizing the clock scheme class;
  based on the received timing information, deriving timing constraint expressions for signal paths between latches in terms of the clock parameters; and combining the timing constraint expressions to define a region of feasible clock operation for the clock scheme class;
  the step of deriving timing constraint expressions including identifying transparent signal paths, wherein each transparent signal path originates at a source latch and terminates at a destination latch; and for each identified transparent signal path, deriving timing constraint expressions applicable to that transparent signal path in terms of the clock parameters;
  the step of deriving timing constraint expressions applicable to each identified transparent signal path in terms of the clock parameters including deriving a timing constraint expression based on a set-up requirement for the destination latch;
  the step of deriving a timing constraint expression based on a set-up requirement for the destination latch including assuming that data arrives at the destination latch at a latest possible time consistent with the data leaving the source latch upon an opening event for the source latch; and requiring the data to arrive at the destination latch prior to a closing event for the destination latch by a time interval greater than a set-up time for the destination latch;
  wherein the derived timing constraint expression based on the set-up requirement comprises the inequality:

$-E[c(0),o(0)]+\Sigma E[c(k),c(k+1)] \geq [Qo(0)-qc(r+1)]+$ $\max\{\Delta RR(0,r+1)+SR(r+1), \Delta FR(0,R+1)+SR(r+1),$ $\Delta FF(0,R+1)+SF(r+1), \Delta RF(0,R+1)+SF(r+1)\}.$ 22. In a computer automated design system for designing digital logic circuits, a computer-implemented method for generating and using a clock characterization model of a digital logic circuit comprising a plurality of interconnected latches and combinational circuits, the method comprising:
  receiving timing information for the latches and for the combinational logic circuits;
  receiving a description of a class of clock scheme for clocking the digital logic circuit;
  selecting clock parameters for parameterizing the clock scheme class;
  based on the received timing information, deriving timing constraint expressions for signal paths between latches in terms of the clock parameters; and
  combining the timing constraint expressions to define a region of feasible clock operation for the clock scheme class;
  the step of deriving timing constraint expressions including identifying transparent signal paths, wherein each transparent signal path originates at a source latch and terminates at a destination latch; and for each identified transparent signal path, deriving timing constraint expressions applicable to that transparent signal path in terms of the clock parameters;
  wherein the step of deriving timing constraint expressions applicable to each identified transparent signal path in terms of the clock parameters includes:
    when the identified transparent signal path has a transparency level of zero, deriving a timing constraint expression based on a hold requirement for the destination latch;
  wherein the step of deriving a timing constraint expression based on a hold requirement for the destination latch includes assuming that data arrives at the destination latch at an earliest possible time consistent with the data leaving the source latch upon an opening event for the source latch; and
  requiring the data to arrive at the destination latch after the previous closing event for the destination latch by a time interval greater than a hold time for the destination latch, wherein the derived timing constraint expression based on the hold requirement comprises the inequality:

$E[c(0),o(0)]-E[c(0),c(1)] \geq [Qc(1)-qo(0)]+\max\{HR(1)-(\delta R(0)+\delta RR(0,1)), HR(1)-(\delta F(0)+\delta FR(0,1)), HF(1)-(\delta F(0)+\delta FF(0,1)), HF(1)-(\delta R(0)+\delta RF(0,1))\},$ where $\delta R(0)=\max\{\delta RR(0,D), \delta FR(0,D), (\delta R(0,C)\},$ and $\delta F(0)=\max\{\delta RF(0,D), \delta FF(0,D), (\delta F(0,C)\}.$ 23. In a computer automated design system for designing digital logic circuits, a computer-implemented method for generating and using a clock characterization model of a digital logic circuit comprising a plurality of interconnected latches and combinational circuits, the method comprising:
  receiving timing information for the latches and for the combinational logic circuits;
  receiving a description of a class of clock scheme for clocking the digital logic circuit;
  selecting clock parameters for parameterizing the clock scheme class;
  based on the received timing information, deriving timing constraint expressions for signal paths between latches in terms of the clock parameters; and
  combining the timing constraint expressions to define a region of feasible clock operation for the clock scheme class;
  the step of deriving timing constraint expressions including identifying transparent signal paths, wherein each transparent signal path originates at a source latch and terminates at a destination latch; and for each identified transparent signal path, deriving timing constraint expressions applicable to that transparent signal path in terms of the clock parameters;
  wherein the step of deriving timing constraint expressions applicable to each identified transparent signal path in terms of the clock parameters comprises:
    when the identified transparent signal path ends in a loop, deriving a timing constraint expression based on a loop requirement for the identified transparent signal path;

wherein the step of deriving a timing constraint expression based on a loop requirement comprises:
  assuming the data arrives at the destination latch at a latest possible time consistent with the data leaving the source latch upon an opening event for the source latch; and
  requiring the data to arrive at the destination latch prior to an opening event for the destination latch;
  wherein the derived timing constraint expression based on the loop requirement comprises the inequality:

$$E[c(r+1),o(r+1)]-E[c(0),o(0)]+\Sigma E[c(k),c(k+1)] \geq [Qo(0)-Qo(r+1)]+$$
$$\max\{\Delta RR(0,r+1)-\Gamma R(r+1), \Delta FR(0,r+1)-\Gamma R(r+1),$$
$$\Delta FF(0,r+1)-\Gamma F(r+1), \Delta RF(0,r+1)-\Gamma F(r+1)\}.$$

24. In a computer automated design system for designing digital logic circuits, a computer-implemented method for generating and using a clock characterization model of a digital logic circuit comprising a plurality of interconnected latches and combinational circuits, the method comprising:
  receiving timing information for the latches and for the combinational logic circuits;
  receiving a description of a class of clock scheme for clocking the digital logic circuit;
  selecting clock parameters for parameterizing the clock scheme class;
  based on the received timing information, deriving timing constraint expressions for signal paths between latches in terms of the clock parameters; and
  combining the timing constraint expressions to define a region of feasible clock operation for the clock scheme class;
  the step of deriving timing constraint expressions including identifying transparent signal paths, wherein each transparent signal path originates at a source latch and terminates at a destination latch; and for each identified transparent signal path, deriving timing constraint expressions applicable to that transparent signal path in terms of the clock parameters;
  receiving a maximum transparency level;
  the step of deriving timing constraint expressions applicable to each identified transparent signal path in terms of the clock parameters including, when the identified transparent signal path has a transparency level equal to the maximum transparency level and the destination latch is transparent, deriving a timing constraint expression based on a maximum transparency requirement for the identified transparent signal path;
  wherein the step of deriving a timing constraint expression based on a maximum transparency requirement includes assuming that data arrives at the destination latch at a latest possible time consistent with the data leaving the source latch upon an opening event for the source latch; and requiring the data to arrive at the destination latch prior to an opening event for the destination latch;
  wherein the derived timing constraint expression based on the maximum transparency requirement comprises the inequality:

$$E[c(r+1),o(r+1)]-E[c(0),o(0)]+\Sigma E[c(k),c(k+1)] \geq [Qo(0)-Qo(r+1)]+$$
$$\max\{\Delta RR(0,r+1)-\Gamma R(r+1), \Delta FR(0,r+1)-\Gamma R(r+1),$$
$$\Delta FF(0,r+1)-\Gamma F(r+1), \Delta RF(0,r+1)-\Gamma F(r+1)\}.$$

25. In a computer automated design system for designing digital logic circuits, a computer-implemented method for generating a clock characterization model of a digital logic circuit comprising a plurality of interconnected latches and combinational circuits, the method comprising:
  receiving timing information for the latches and for the combinational logic circuits;
  receiving a description of a class of clock scheme for clocking the digital logic circuit;
  selecting clock parameters for parameterizing the clock scheme class;
  based on the received timing information, deriving timing constraint expressions for signal paths between latches in terms of the clock parameters; and
  combining the timing constraint expressions to define a region of feasible clock operation for the clock scheme class;
  the step of deriving timing constraint expressions including:
    receiving a maximum transparency level;
    identifying transparent signal paths which have a transparency level less than or equal to the maximum transparency level and which do not contain a loop unless the transparent signal path ends in the loop, wherein each transparent signal path originates at a source latch and terminates at a destination latch;
    for all identified transparent signal paths, deriving a timing constraint expression based on a set-up requirement for the destination latch in the identified transparent signal path;
    for identified transparent signal paths which have a transparency level of zero, deriving a timing constraint expression based on a hold requirement for the destination latch in the identified transparent signal path;
    for identified transparent signal paths which end in a loop, deriving a timing constraint expression based on a loop requirement for the identified transparent signal path; and
    for identified transparent signal paths which have a transparency level equal to the maximum transparency level, have a transparent destination latch, and do not end in a loop, deriving a timing constraint expression based on a maximum transparency requirement for the identified transparent signal path; and
  the step of combining the timing constraint expressions to define a region of feasible clock operation including:
    expressing the timing constraint expressions as linear inequalities in which a linear combination of the clock parameters is compared to a constant,
    combining all linear inequalities which contain some linear combination of the clock parameters into a single linear inequality, and
    after all linear inequalities which contain a same linear combination of the clock parameters have been combined into a single linear inequality, eliminating redundant linear inequalities.

26. In a computer automated design system for designing digital logic circuits, a computer readable medium for using a clock characterization model for a digital logic circuit comprising a plurality of interconnected latches and combinational logic circuits, the computer readable medium storing a clock characterization modeler for instructing a processor to:

receiving timing information for the latches and for the combinational logic circuits;

receiving a description of a class of clock scheme for clocking the digital logic circuit;

selecting clock parameters for parameterizing the clock scheme class;

based on the received timing information, deriving timing constraint expressions for signal paths between latches in terms of the clock parameters; and combining the timing constraint expressions to define a region of feasible clock operation, for the clock scheme class, that defines an n-dimensional range of said clock parameters that is consistent with said timing information for said latches and said clock scheme for use in testing feasibility of using said digital logic circuit connected to a host circuit by comparing ranges of clocking allowed for said host circuit with said region of feasible clock operation.

27. The computer readable medium of claim 26, wherein the clock characterization modeler further instructs the processor to:

identify transparent signal paths; and for each identified transparent signal path, derive timing constraint expressions applicable to that transparent signal path in terms of the clock parameters.

28. The computer readable medium of claim 27, wherein:

each identified transparent signal path originates at a source latch and terminates at a destination latch; and the timing constraint expressions are selected from a group comprising:
  a timing constraint expression based on a set-up requirement for the destination latch,
  a timing constraint expression based on a hold requirement for the destination latch,
  a timing constraint expression based on a loop requirement for the identified transparent signal path, and
  a timing constraint expression based on a maximum transparency requirement for the identified transparent signal path.

29. The computer readable medium of claim 26 further storing a propagation modeler for instructing the processor to:

receive a physical description of the digital logic circuit, the description including:
  a listing of the latches in the digital logic circuit,
  a listing of the combinational logic circuits in the digital logic circuit, and
  a description of the interconnection of the latches and combinational logic circuits within the digital logic circuit; and generate the timing information for the latches and for the combinational logic circuits based on the received physical description.

30. A computer automated design system for designing digital logic circuits, comprising:

a clock characterization modeler for generating a clock characterization model for a digital logic circuit for a specified class of clock scheme, wherein the digital logic circuit comprises a plurality of interconnected latches and combinational logic circuits and the clock characterization model defines a region of feasible clock operation for the specified clock scheme class;

a propagation modeler for generating propagation models of combinational logic circuits and latches within the digital logic circuit;

a design checker for checking that the clock scheme applied to the digital logic circuit falls within the region of feasible clock operation for the specified clock scheme class.

31. In a computer automated design system for designing digital logic circuits, a computer-implemented method for designing a first digital logic circuit, wherein the first digital logic circuit comprises a second digital logic circuit, the method comprising:

receiving a clock characterization model for the second digital logic circuit defining a group of timing ranges under a specified clock scheme class that fully characterize feasible operation of said second digital logic circuit;

selecting a trial clock scheme within the specified clock scheme class for clocking the first digital logic circuit; and determining whether the trial clock scheme falls within the group of timing ranges for characterizing the feasible operation of said second digital logic circuit.

32. The method of claim 31, wherein the step of selecting a trial clock scheme comprises:

selecting a trial clock scheme which is within the region of feasible clock operation for the specified clock scheme class and which minimizes a period of the trial clock scheme.

33. A method of identifying a candidate digital circuit that is operable with host digital circuit, comprising the steps of:

identifying a candidate circuit with inputs and outputs required for compatibility with said host digital circuit and a clock scheme of said digital host;

obtaining timing data characterizing said candidate digital circuit in terms of a space of allowed timing intervals consistent with said clock scheme;

comparing said allowed timing intervals with a range permitted for clocking said host digital circuit;

accepting said candidate contingent on a result of said step of comparing.

* * * * *